(12) United States Patent
Madadi et al.

(10) Patent No.: US 10,056,881 B2
(45) Date of Patent: Aug. 21, 2018

(54) CHARGE SHARING FILTER

(71) Applicant: Huawei Technologies Co., Ltd., Shenzhen (CN)

(72) Inventors: Iman Madadi, Delft (NL); Massoud Tohidian, Delft (NL); Robert Bogdan Staszewski, Delft (NL)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 17 days.

(21) Appl. No.: 15/443,443

(22) Filed: Feb. 27, 2017

(65) Prior Publication Data
US 2017/0170810 A1    Jun. 15, 2017

Related U.S. Application Data

(63) Continuation of application No. PCT/EP2014/068892, filed on Sep. 5, 2014.

(51) Int. Cl.
*H03H 15/02*    (2006.01)
*H03H 19/00*    (2006.01)
*H03H 15/00*    (2006.01)

(52) U.S. Cl.
CPC ........ *H03H 19/004* (2013.01); *H03H 15/023* (2013.01)

(58) Field of Classification Search
CPC ............................ H03H 15/023; H03H 19/004
See application file for complete search history.

(56) References Cited

U.S. PATENT DOCUMENTS

| | | | |
|---|---|---|---|
| 8,766,834 B2 * | 7/2014 | Shiozaki | ............... H03H 15/00 341/122 |
| 2005/0233725 A1 | 10/2005 | Muhammad et al. | |
| 2009/0009155 A1 | 1/2009 | Hosokawa et al. | |
| 2011/0148513 A1 | 6/2011 | Lee | |
| 2012/0092065 A1 | 4/2012 | Sano et al. | |
| 2013/0099828 A1 | 4/2013 | Morita | |

(Continued)

FOREIGN PATENT DOCUMENTS

| | | |
|---|---|---|
| CN | 101061643 A | 10/2007 |
| CN | 103636125 A | 3/2014 |
| JP | H10243290 A | 9/1998 |

(Continued)

OTHER PUBLICATIONS

Geis, A., et al., "A 0.5 mm2 Power-Scalable 0.5-3.8-GHz CMOS DT-SDR Receiver With Second-Order RF Band-Pass Sampler" IEEE Journal of Solid-State Circuits, vol. 45, No. 11, Nov. 2010, 13 pages.

(Continued)

*Primary Examiner* — Patrick O'Neill
(74) *Attorney, Agent, or Firm* — Conley Rose, P.C.

(57) ABSTRACT

A charge sharing filter includes a rotating capacitor, and a plurality of elementary filters, each elementary filter comprising: an elementary switch coupled between a first node of the respective elementary filter and a second node of the respective elementary filter; and a history capacitor coupled to the first node of the respective elementary filter, wherein the second nodes of the plurality of elementary filters are interconnected with the rotating capacitor in one interconnecting node.

15 Claims, 23 Drawing Sheets

(56) References Cited

U.S. PATENT DOCUMENTS

2013/0222164 A1 8/2013 Shiozaki et al.
2015/0214926 A1 7/2015 Tohidian et al.

FOREIGN PATENT DOCUMENTS

| JP | 2009065405 A | 3/2009 |
|---|---|---|
| JP | 2012023615 A | 2/2012 |
| KR | 20110070774 A | 6/2011 |
| WO | 2013189546 A1 | 12/2013 |

OTHER PUBLICATIONS

Tohidian, M., et al., "A 2mW 800MS/s 7th Order Discrete-Time IIR Filter with 400kHz-to-30MHz BW and 100dB Stop-Band Rejection in 65nm CMOS", ISSCC 2013 / Session 10 / Analog Techniques / 10.2, Feb. 19, 2013, 3 pages.

Madadi, I., et al., "A 65nm CMOS High-IF Superheterodyne Receiver with a High-Q Complex BPF", RTU2A-3, IEEE Radio Frequency Integrated Circuits Symposium, Jun. 2-4, 2013, pp. 323-326.

Oskooei, M., et al., "A CMOS 4.35-mW +22-dBm IIP3 Continuously Tunable Channel Select Filter for WLANN/WiMAX Receivers", IEEE Journal of Solid-State Circuits, vol. 46, No. 6, Jun. 2011, 10 pages.

Franks, L. E., et al., "An Alternative Approach to the Realization of Network Transfer Functions: The N-Path Filter", The Bell System Technical Journal, vol. 39, Issue 5, Sep. 1960, pp. 1321-1350.

Mirzaei, A. et al., "Architectural Evolution of Integrated M-Phase High-Q Bandpass Filters", IEEE Transactions on Circuits and Systems-I: Regular Papers, vol. 59, No. 1, Jan. 2012, 14 pages.

Lo, T., et al., "A Wide Tuning Range Gm-C Filter for Multi-Mode CMOS Direct-Conversion Wireless Receivers," IEEE Journal of Solid-State Circuits, vol. 44, No. 9, Sep. 2009, pp. 2515-2524.

Pirola, A., et al., "Current-Mode, WCDMA Channel Filter With In-Band Noise Shaping," IEEE Journal of Solid-State circuits, vol. 45, No. 9, Sep. 2010, pp. 1770-1780.

Darvishi, M., et al., "Design of Active N-path Filters," IEEE Journal of Solid-State Circuits, vol. 48, No. 12, Dec. 2013, 16 pages.

Ghaffari, A., et al., "Tunable High-Q N-Path Band-Pass Filters: Modeling and Verification," IEEE Journal of Solid-State Circuits, vol. 46, No. 5, May 2011, pp. 998-1010.

Darvishi, M., et al., "Widely Tunable 4th Order Switched Gm-C Band-pass Filter Based on N-path Filters," Integrated Circuit Design, Faculty of Electrical Engineering, Mathematics and Computer Science, Nov. 2012, 15 pages.

Tohidian, M., et al., "A Fully Integrated Highly Reconfigurable Discrete-time Super-Heterodyne Receiver," ISSCC, Session 3, RF Techniques, 3.8, 2014, 3 pages.

Muhammad, K., et al., "A Discrete-Time Bluetooth Receiver in a 013µ.m Digital CMOS Process," ISSCC, Session 15, Wireless Consumer ICs, 15.1, 2004, 10 pages.

Latiri, A., et al., "A Reconfigurable RF sampling receiver for multistandard applications," Elsevier, ScienceDirect, C. R. Physique 7, 2006, pp. 785-793.

Muhammad, K., et al., "Direct RF Sampling Mixer with Recursive Filtering in Charge Domain," ISCAS, 2004, pp. 577-580.

Foreign Communication From a Counterpart Application, PCT Application No. PCT/EP2014/068892, International Search Report dated May 18, 2015, 5 pages.

Foreign Communication From a Counterpart Application, PCT Application No. PCT/EP2014/068892, Written Opinion dated May 18, 2015, 6 pages.

Foreign Communication From a Counterpart Application, Korean Application No. 10-2016-7029470, Korean Office Action dated Oct. 24, 2017, 6 pages.

Foreign Communication From a Counterpart Application, Korean Application No. 10-2016-7029470, English Translation of Korean Office Action dated Oct. 24, 2017, 4 pages.

Machine Translation and Abstract of Japanese Publication No. JPH10243290, Sep. 11, 1998, 11 pages.

Foreign Communication From a Counterpart Application, Japanese Application No. 2017-505707, Japanese Office Action dated Jan. 9, 2018, 3 pages.

Foreign Communication From a Counterpart Application, Japanese Application No. 2017-505707, English Translation of Japanese Office Action dated Jan. 9, 2018, 3 pages.

Foreign Communication From a Counterpart Application, Chinese Application No. 2014800763839, Chinese Search Report dated Jan. 10, 2018, 2 pages.

Foreign Communication From a Counterpart Application, Chinese Application No. 201480076383.9, Chinese Office Action dated Jan. 19, 2018, 4 pages.

\* cited by examiner

CHARGE SHARING FILTER

CROSS-REFERENCE TO RELATED APPLICATIONS

This application is a continuation of International Application No. PCT/EP2014/068892, filed on Sep. 5, 2014, which is hereby incorporated by reference in its entirety.

TECHNICAL FIELD

The present disclosure relates to a charge sharing filter, in particular a multi-phase charge sharing discrete-time band pass filter and a method for filtering a current signal by a charge sharing filter.

BACKGROUND

High-quality (Q) filters are the key building block in any receiver (RX) because not only do they provide selectivity also the linearity performance of RX is mainly dependent on the linearity of the filter. A simplified block diagram of the typical front-end 100 of RX is shown in FIG. 1. The wanted RF input voltage at the antenna 107 is usually accompanied by large adjacent channel interferers, out-of-band blockers, and/or transmitted (TX) blockers. The first stage of the front-end is usually a low-noise amplifier (LNA) 101, which provides input matching and gain for the RX band. The amplified RF signal is down-converted to intermediate-frequency (IF) or base-band (BB) by a mixer 103 using a local oscillator (LO) signal 102. The down-converted signal is input to a filter 105 to select wanted signal and filter out blockers and interferers.

There are different types of filters, such as LC, $G_m$-C, biquad, N-path, and IIR. There are lots of problems associated with these filters. LC filters are very linear, but they do not provide enough selectivity. So they are not applicable for cellular RX. Some other filters such as $G_m$-C filters not only have a very complex structure but also consume much power compared to filters without active components. Furthermore, input-referred noise of the Gm-C filters is much larger compared to other filters due to the number of active $g_m$ cells used. Also, the linearity of the Gm-C structures is worse compared to other structures. Biquad filters are divided into two subcategories, sample-based- and continuous-time filters. In both subcategories, the filter cores are based on operational amplifiers (opamps) or $G_m$ cells. Usually, biquad filters consume much power in active components (i.e., opamps). Also, biquad filters must be made very bulky to reduce flicker noise generated by active devices. An N-path filter concept is based on frequency translation techniques utilizing mixers because the mixers are required to transfer signals in the frequency domain. Therefore, the N-path filter is the low-pass RC filter, which is converted to band-pass by translation via mixer. Also, filters combining the N-path concept with the $G_m$-C structure have the above mentioned problems. The N-path filters offer a very good selectivity but at the cost of replicas in their transfer functions. These replicas make the filter ineffective to blockers and interferers. Also, input second order intercept (IIP2) of the N-path filters are limited because the generated second order intermodulation product (IM2) in low frequencies coinciding with the wanted signal is up-converted by the mixer.

Charge-sampling infinite impulse response (IIR) filters are based on capacitors and switches only. Therefore, the power consumption in these filters is only related to the power for driving the switches. Also, these filters are less complicated and highly linear because there is no active component (i.e. no operational amplifier) in these filters. However, IIR filters are low-pass, and it is not effective for using these IIR filters in high-IF frequencies.

Hence, it is desired to provide a different kind of filters (for example, Band-Pass-Filter) without the above mentioned problems that would be compatible with the super-heterodyne architecture.

SUMMARY

It is the object of the invention to provide a power-efficient charge sharing filter offering a high degree of frequency selectivity.

This object is achieved by the features of the independent claims. Further implementation forms are apparent from the dependent claims, the description and the figures.

The invention is based on the idea that frequency selectivity of a charge sharing filter can be controlled by the ratio of capacitors and the sampling frequency. Therefore, the bandwidth is precise and can be set to any value by adjusting capacitor ratios inside the filter. The charge sharing filter, in particular the multi-phase charge-sharing Band-Pass-Filter (CS-BPF), can work at a very high sampling frequency. Also, the circuit does not need to rely on any frequency translation techniques. Therefore, The IM2 components are not generated at all, and IIP2 of this filter is near infinite. Unlike the N-path filter, which has lots of replicas, CS-BPF can be designed not to have any replicas at all up to the sampling frequency ($f_s$). The reason is that CS-BPF is not working based on frequency translation technique. The CS-BPF has no limitation in the rejection of far-out frequencies because the filter has no frequency translated signals. CS-BPF can work in discrete-time (DT) domain, and its components may be just transistors acting as switches and capacitors. There have to be no active components such as op-amps or $G_m$ inside the filter. The key CS-BPF component is a capacitor. There have to be no resistors inside the filter and the mismatch between the capacitors is inherently much less compared to the mismatch of resistor to capacitor and $G_m$ to capacitor.

In order to describe the invention in detail, the following terms, abbreviations and notations will be used:
CS-BPF: charge sharing band pass filter,
DT: discrete time,
Q: quality factor,
RX: receiver,
TX: transmitter,
LNA: low noise amplifier,
IF: intermediate frequency,
BB: base-band,
BPF: band pass filter,
IIR: infinite impulse response,
IIP2: input second order intercept,
IM2: second order intermodulation,
LO: local oscillator.

According to a first aspect, the invention relates to a charge sharing filter, comprising a rotating capacitor; and a plurality of elementary filters, each elementary filter comprising an elementary switch coupled between a first node of the respective elementary filter and a second node of the respective elementary filter; and a history capacitor coupled to the first node of the respective elementary filter, wherein the second nodes of the plurality of elementary filters are interconnected with the rotating capacitor in one interconnecting node.

In a first possible implementation form of the charge sharing filter according to the first aspect, the second nodes of the plurality of elementary filters are interconnected with the rotating capacitor in one interconnecting node such that charges provided by a plurality of signal sources, each signal source connected to a respective first node of the plurality of elementary filters, are shared between the history capacitors of the plurality of elementary filters and the rotating capacitor depending on switching states of the elementary switches.

The rotating capacitor can be a charge rotating capacitor. The signal source can be either a current source or a voltage source.

The charge sharing filter is very power-efficient and offers a high degree of frequency selectivity using the following options.
- controlling selectivity by the ratio of capacitors and the switching states, e.g. by the sampling frequency. Therefore, the bandwidth is precise and can be set to any value by adjusting capacitor ratios inside the filter;
- working at a very high sampling frequency, i.e. in the radio frequency ranges up to several Gigahertz. The circuit does not have to rely on any frequency translation technique. Therefore, The IM2 components are not generated at all, and IIP2 of this filter is infinite;
- using filter designs providing charge sharing filters, in particular CS-BPF not having any replicas at all up to the $f_S$. The reason is that CS-BPF is not working based on frequency translation technique;
- not working based on frequency translation;
- having no limitation in the rejection of far-out frequencies because the filter has no frequency translated signals;
- working in DT domain;
- providing charge sharing filters, in particular CS-BPF which components are just transistors acting as switches and capacitors;
- providing charge sharing filters, in particular CS-BPF without active components such as op-amps or $G_m$ inside the filter;
- providing charge sharing filters, in particular CS-BPF which key component is a capacitor. There are no resistors inside the filter and the mismatch between the capacitors is inherently much less compared to the mismatch of resistor to capacitor and $G_m$ to capacitor;
- improving $2^{nd}$-order linearity;
- suppressing replicas;
- improving rejection at far-out frequencies;
- eliminating power hungry and speed limiting active components such as op-amp or $G_m$ inside the filter;
- improving IIP2 performance;
- increasing selectivity without increasing cost of power consumption and area;
- solving component mismatch without extensive and complex mismatch calibration.

In a second possible implementation form of the charge sharing filter according to the first aspect or according to the first implementation form of the first aspect, the signal sources are current sources, each current source connected to a respective first node of the plurality of elementary filters.

When the signal sources, e.g. current sources, are included in the charge sharing filter, the coupling of the signal sources and the charge sharing filter can be increased.

In a third possible implementation form of the charge sharing filter according to the first aspect as such or according to the first or second implementation form of the first aspect, the first nodes of the plurality of elementary filters are both an input and an output of the charge sharing filter, the input configured to receive a current signal and the output configured to provide a voltage signal, wherein the voltage signal is provided by filtering the current signal based on a filter characteristic of the charge sharing filter.

When the first nodes of the plurality of elementary filters are both an input and an output of the charge sharing filter, the filter design is simplified and chip space can be saved.

In a fourth possible implementation form of the charge sharing filter according to the third implementation form of the first aspect, the filter characteristic is a complex-valued band pass filter comprising an in-phase component and a quadrature component.

When the filter characteristic is a complex-valued band pass filter complex modulation tasks can be implemented.

In a fifth possible implementation form of the charge sharing filter according to the first aspect as such or according to any of the preceding implementation forms of the first aspect, the elementary switches of the plurality of elementary filters are periodically switched.

When the plurality of elementary filters are periodically switched, the charge sharing filter can be applied in discrete time signal processing.

In a sixth possible implementation form of the charge sharing filter according to the first aspect as such or according to any of the preceding implementation forms of the first aspect, the elementary switches of the plurality of elementary filters are switched based on a sampling period.

When the elementary switches of the plurality of elementary filters are switched based on a sampling period, the filter can be applied in sampled systems.

In a seventh possible implementation form of the charge sharing filter according to the fifth implementation form of the first aspect, a charge accumulated in the rotating capacitor and the history capacitors of the plurality of elementary filters is based on the sampling period.

When a charge accumulated in the rotating capacitor and the history capacitors of the plurality of elementary filters is based on the sampling period, frequency selectivity can be controlled by the ratio of capacitors and the switching states, i.e. controlled by the sampling frequency or sampling period. Then the bandwidth is precise and can be set to any value by adjusting capacitor ratios inside the filter.

In an eighth possible implementation form of the charge sharing filter according to the first aspect as such or according to any of the preceding implementation forms of the first aspect, the elementary switches of the plurality of elementary filters are switched based on a multi-phase switching signal.

When the elementary switches of the plurality of elementary filters are switched based on a multi-phase switching signal higher order IIR filters can be implemented which frequency peak and frequency bandwidth can be precisely controlled by the multi-phase switching signal.

In a ninth possible implementation form of the charge sharing filter according to the seventh implementation form of the first aspect, the multi-phase switching signal provides a first signal level for one elementary switch of the plurality of elementary filters while providing a second signal level for the other elementary switches of the plurality of elementary filters.

The switching can be easily implemented by using such two signal levels. This signal logic can be easily implemented by using transistors.

In a tenth possible implementation form of the charge sharing filter according to the first aspect as such or according to any of the preceding implementation forms of the first aspect, the rotating capacitor, the elementary switches of the plurality of elementary filters and the history capacitors of the plurality of elementary filters are transistors.

Transistors can be easily and cost efficiently implemented for the switching, for example on a chip. Cost efficient transistors have reduced space requirements on a chip compared to a solution with active elements such as operational amplifiers.

In an eleventh possible implementation form of the charge sharing filter according to the first aspect as such or according to any of the preceding implementation forms of the first aspect, the charge sharing filter further comprises a plurality of second elementary filters, each second elementary filter comprising an elementary switch coupled between the interconnecting node and a third node of the respective second elementary filter; and a history capacitor coupled to the third node, such that charges provided by the plurality of signal sources are shared between the history capacitors of the plurality of elementary filters, the history capacitors of the plurality of second elementary filters and the rotating capacitor depending on switching states of the elementary switches of the plurality of elementary filters and the elementary switches of the plurality of second elementary filters.

By using such second elementary switches frequency selectivity can be further increased as multi order IIR filters can be implemented. The bandwidth is precise and can be set to any value by adjusting capacitor ratios inside the filter.

In a twelfth possible implementation form of the charge sharing filter according to the eleventh implementation form of the first aspect, the plurality of second elementary filters are partitioned in cascades of first order IIR filters, each second elementary filter forming one first order IIR filter.

The IIR filters can have high frequency selectivity and provide steep slopes.

In a thirteenth possible implementation form of the charge sharing filter according to the eleventh implementation form of the first aspect, the plurality of second elementary filters are partitioned in cascades of higher order IIR filters, each triplet of three second elementary filters forming one higher order IIR filter.

The higher order IIR filters can be third order filters.

Third order or multi order IIR filters provide a higher frequency selectivity and provide steeper slopes than first order IIR filters.

In a fourteenth possible implementation form of the charge sharing filter according to any of the eleventh to the thirteenth implementation forms of the first aspect, the first nodes of the plurality of elementary filters are an input of the charge sharing filter, the input configured to receive a current signal; the third nodes of the plurality of second elementary filters are an output of the charge sharing filter, the output configured to provide a voltage signal, wherein the voltage signal is provided by filtering the input signal based on a filter characteristic of the charge sharing filter.

When the first nodes of the plurality of elementary filters are an input of the charge sharing filter and the third nodes of the plurality of second elementary filters are an output of the charge sharing filter, input and output of the filter can be decoupled.

According to a second aspect, the invention relates to a method for filtering a signal by a charge sharing filter, the charge sharing filter comprising a rotating capacitor; and a plurality of elementary filters, each elementary filter comprising an elementary switch coupled between a first node of the respective elementary filter and a second node of the respective elementary filter; and a history capacitor coupled to the second node of the respective elementary filter, wherein the second nodes of the plurality of elementary filters are interconnected with the rotating capacitor in one interconnecting node, the method comprising providing a current signal at the first nodes of the plurality of elementary filters.

The signal can be a current signal or a voltage signal.

Such a method provides a very power-efficient way for filtering and offers a high degree of frequency selectivity by:
controlling selectivity by the ratio of capacitors and the switching states, e.g. by the sampling frequency. Therefore, the bandwidth is precise and can be set to any value by adjusting capacitor ratios inside the filter;
working at a very high sampling frequency, i.e. in the radio frequency ranges up to several Gigahertz. The circuit does not have to rely on any frequency translation technique. Therefore, The IM2 components are not generated at all, and IIP2 of this filter is infinite;
using filter designs providing charge sharing filters, in particular CS-BPF not having any replicas at all up to the $f_S$. The reason is that CS-BPF is not working based on frequency translation technique;
not working based on frequency translation;
having no limitation in the rejection of far-out frequencies because the filter has no frequency translated signals;
working in DT domain;
providing charge sharing filters, in particular CS-BPF which components are just transistors acting as switches and capacitors;
providing charge sharing filters, in particular CS-BPF without active components such as op-amps or $G_m$ inside the filter;
providing charge sharing filters, in particular CS-BPF which key component is a capacitor. There are no resistors inside the filter and the mismatch between the capacitors is inherently much less compared to the mismatch of resistor to capacitor and $G_m$ to capacitor;
improving $2^{nd}$-order linearity;
suppressing replicas;
improving rejection at far-out frequencies;
eliminating power hungry and speed limiting active components such as op-amp or $G_m$ inside the filter;
improving IIP2 performance;
increasing selectivity without increasing cost of power consumption and area;
solving component mismatch without extensive and complex mismatch calibration.

In a first possible implementation form of the method for filtering a signal according to the second aspect, the method comprises sharing charges provided by the signal between the history capacitors of the plurality of elementary filters and the rotating capacitor depending on switching states of the elementary switches to provide a voltage signal at the first nodes of the plurality of elementary filters.

According to a third aspect, the invention relates to a computer program with program code for performing the method according to the second aspect, when the computer program runs on a computer.

The computer program can be flexibly designed such that an update of the requirements is easy to achieve. The computer program product may run on a lot of different processors.

According to a fourth aspect, the invention relates to a computer program product comprising a readable storage medium storing program code thereon for use by a computer executing the method according to the second aspect.

By using a readable storage medium, the computer program product can be flexibly used in different environments.

BRIEF DESCRIPTION OF THE DRAWINGS

Further embodiments of the invention will be described with respect to the following figures, in which:

FIG. 4B shows a timing diagram depicting exemplary switching signals 410 of the charge sharing band pass filter 400 depicted in FIG. 4a;

FIG. 5B shows a timing diagram depicting exemplary switching signals 510 of the charge sharing band pass filter 500 depicted in FIG. 5a;

FIG. 6B shows a diagram depicting exemplary switching signals 610 of the charge sharing band pass filter 600 depicted in FIG. 6a;

FIG. 7B shows a diagram depicting exemplary switching signals 710 of the charge sharing band pass filter 700 depicted in FIG. 7a;

DETAILED DESCRIPTION OF EMBODIMENTS

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

The devices and methods described herein may be based on charge sharing filters, in particular charge sharing band pass filters. It is understood that comments made in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

The methods and devices described herein may be implemented in filter structures. The described devices and systems may include software units and hardware units. The described devices and systems may include integrated circuits and/or passives and may be manufactured according to various technologies. For example, the circuits may be designed as logic integrated circuits, analog integrated circuits, mixed signal integrated circuits, optical circuits, memory circuits and/or integrated passives. The circuits may be implemented in hardware on a chip.

Figure 1:
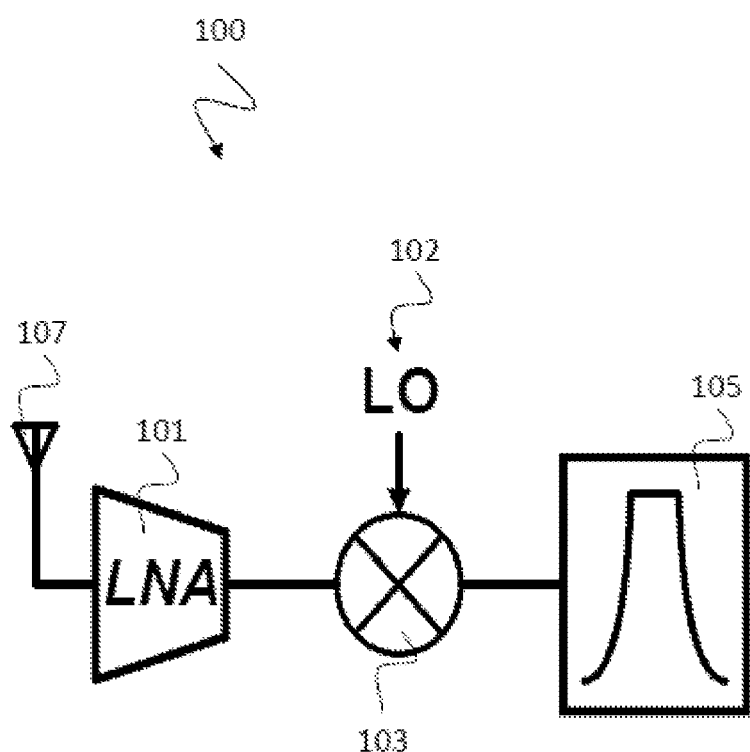
FIG. 1 shows a block diagram of a common receiver front end.
Figure 2:
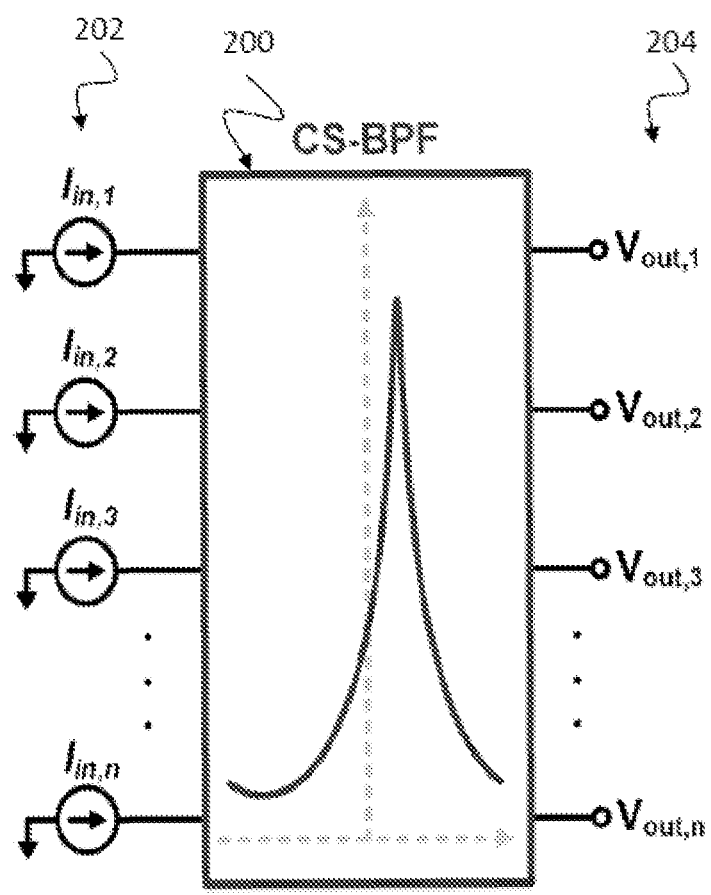
FIG. 2 shows a block diagram of a charge sharing filter 200 according to an implementation form.

FIG. 2 shows a block diagram of a charge sharing filter 200 according to an implementation form. The circuit is a complex (in-phase and quadrature components) filter in which its input is e.g. a current 202, and its output is e.g. a voltage 204. As can be seen from FIG. 2, the filter 200 is a band pass filter amplifying signals at the center frequency.

Figure 3A:
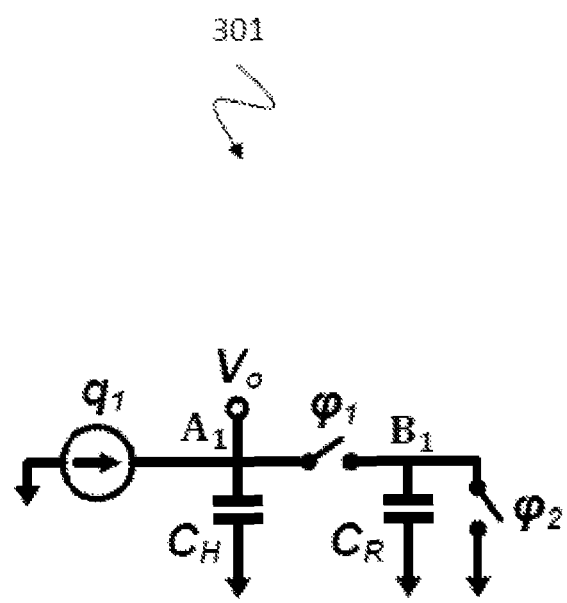
FIG. 3A shows a block diagram of a first order low pass IIR filter 301.
Figure 3B:
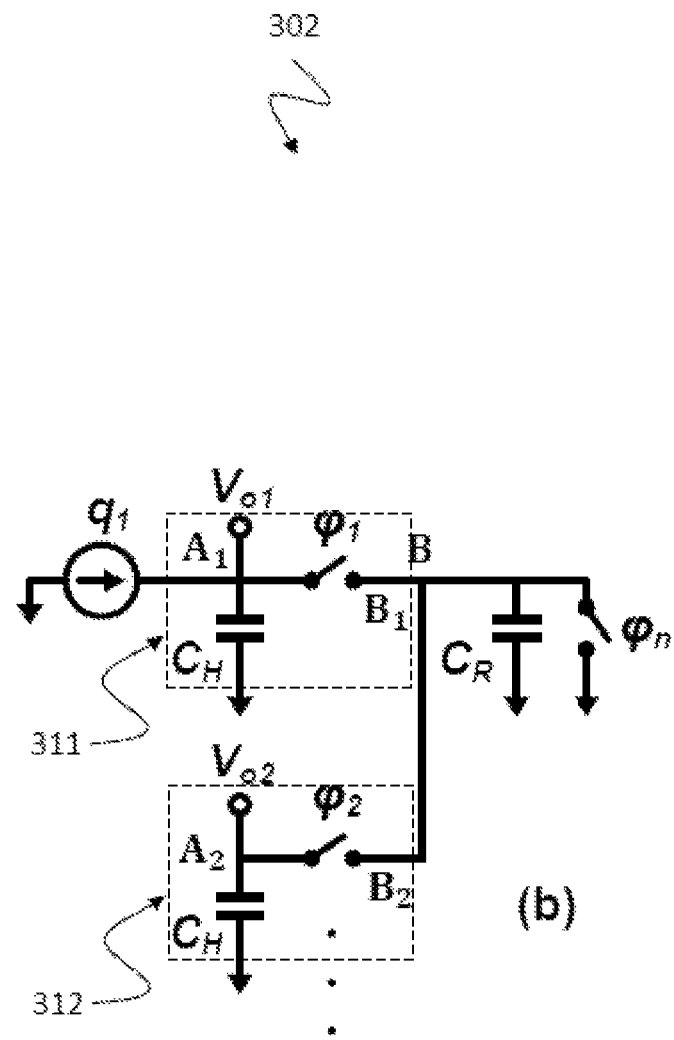
FIG. 3B shows a block diagram of a multi order low pass IIR filter 302.
Figure 3C:
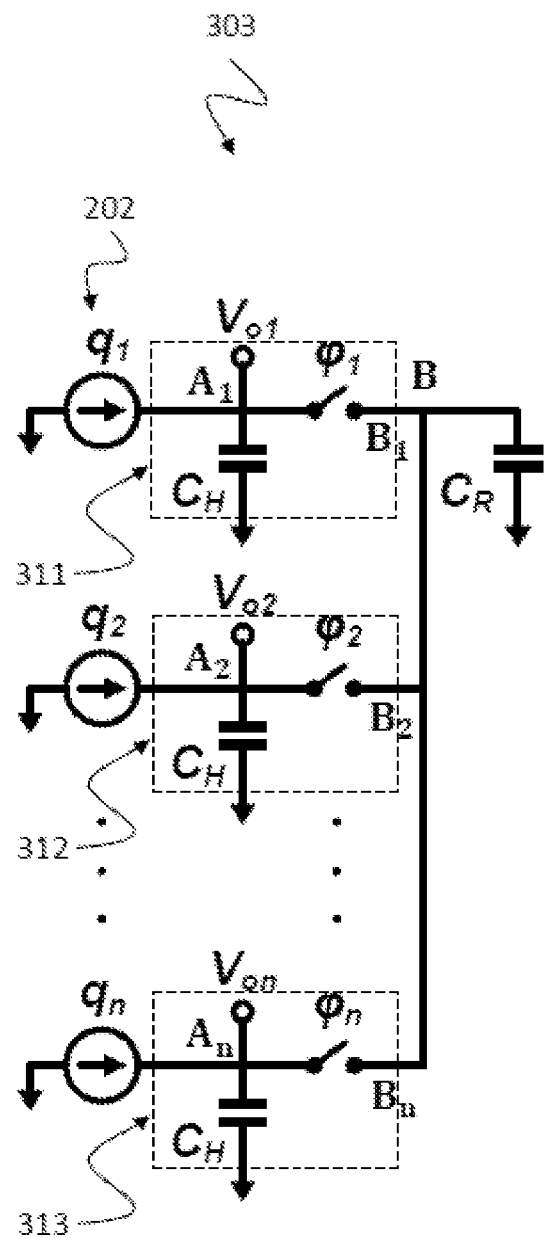
FIG. 3C shows a block diagram of a first order charge sharing band pass filter 303 in n/n mode according to an implementation form.
Figure 3D:
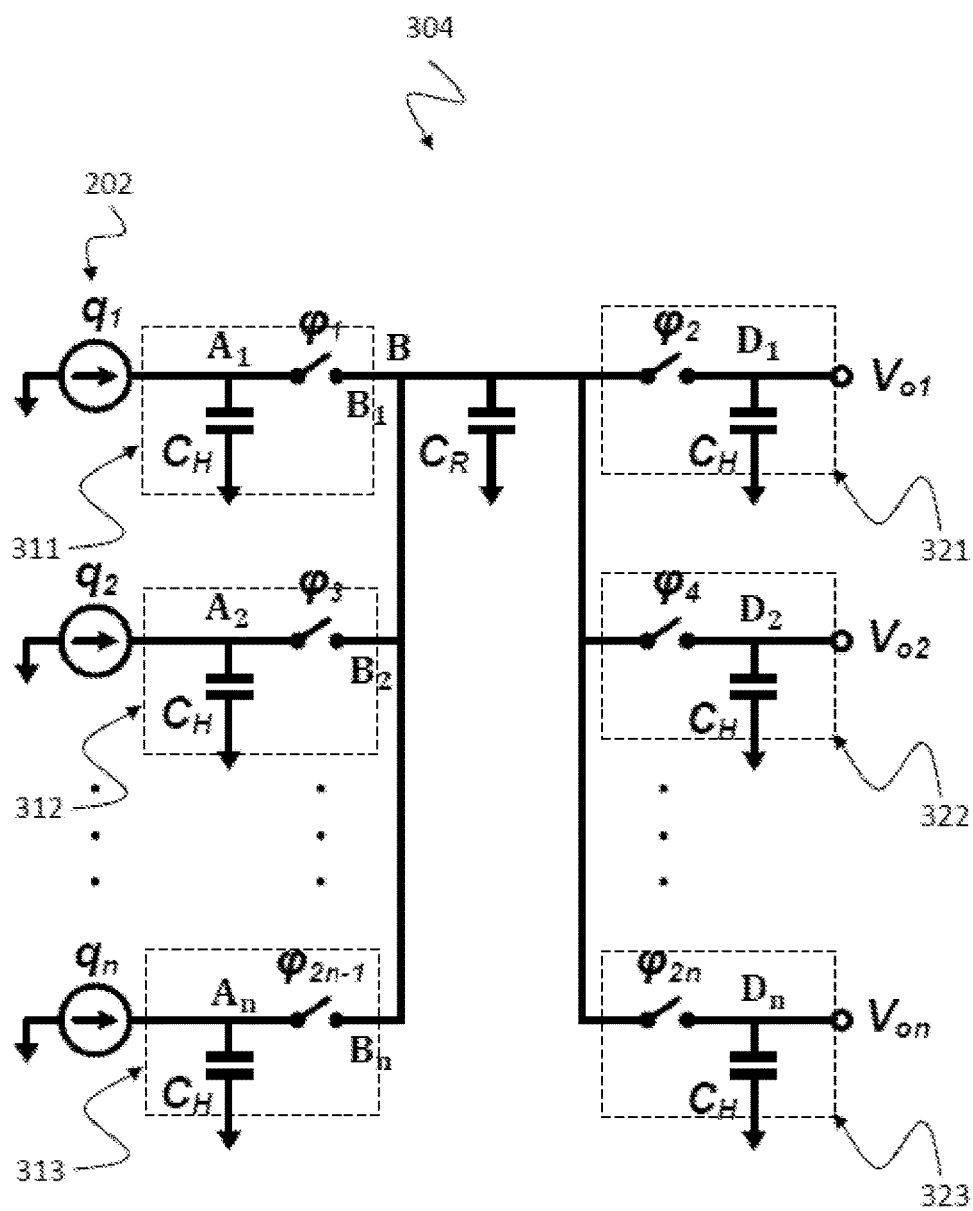
FIG. 3D shows a block diagram of a first order charge sharing band pass filter 304 cascaded with first order IIR filter in n/(2n) mode according to an implementation form.
Figure 3E:
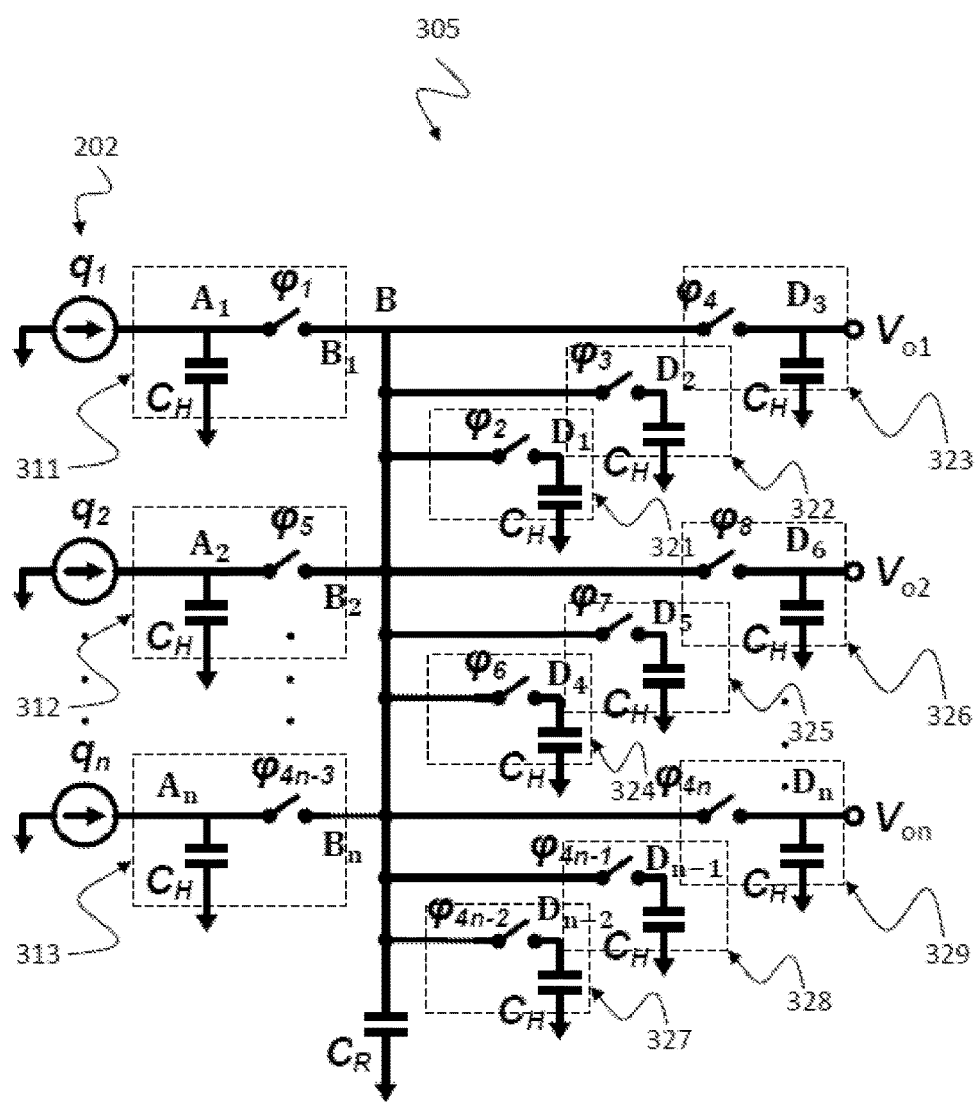
FIG. 3E shows a block diagram of a first order charge sharing band pass filter 305 cascaded with third order IIR filter in n/(4n) mode according to an implementation form.

The schematics of different DT filters are shown in FIGS. 3A to 3E. The simple IIR filter is drawn in FIG. 3A while a high-order low-pass IIR filter (FIG. 3B) can be achieved by rotating a charge via $C_R$ between different $C_H$ (history) capacitors. The high-order low-pass IIR filter can be converted to a $1^{st}$-order CS-BPF simply by applying complex inputs with specific different phases ($\Delta\Phi=2\pi/n$, n: number of inputs) to $C_H$ capacitors as shown in FIG. 3C. FIG. 3D shows how it is possible to cascade a low-pass IIR filter with 1st-order CS-BPF to increase not only the quality factor (Q) of the filter but also an order of the filter for frequencies in the transition band of the low-pass IIR filter. The cascade of $3^{th}$ order low-pass IIR filter with 1st-order CS-BPF is shown in FIG. 3E.

Basic schematics of the CS-BPF are shown in FIGS. 4 to 7. The input currents flow into input history capacitors ($C_{H1}$, $C_{H3}$, $C_{H5}$, ..., $C_{Hn}$) and then into rotating capacitors ($C_R$) and then get integrated. The integrated currents will convert into charges in each $C_H$ and $C_R$. In this disclosure the charge may be calculated based on $q_i[n]=\int_{(n-1) \cdot T_S}^{n \cdot T_S} i_i(t)dt$, where $T_S$ is the sampling time. It is possible to create a BPF by sharing a portion of charge between different capacitors associated with complex inputs.

FIG. 3C shows a block diagram of a first order charge sharing band pass filter 303 in n/n mode according to an implementation form.

The charge sharing band pass filter 303 includes a rotating capacitor $C_R$; and a plurality of elementary filters 311, 312, 313. Each elementary filter includes an elementary switch $\varphi_i$ (i=1, 2, ..., n) coupled between a first node $A_i$ (i=1, 2, ..., n) of the respective elementary filter and a second node $B_i$ (i=1, 2, ..., n) of the respective elementary filter; and a history capacitor $C_H$ coupled to the second node $B_i$ of the respective elementary filter. The second nodes $B_i$ of the plurality of elementary filters are interconnected with the rotating capacitor $C_R$ in one interconnecting node B such that charges provided by a plurality of signal sources 202, e.g. current sources, each signal source connected to a respective first node $A_i$ of the plurality of elementary filters, are shared between the history capacitors $C_H$ of the plurality of elementary filters and the rotating capacitor $C_R$ depending on switching states of the elementary switches $\varphi_i$.

The charge sharing band pass filter 303 may include the plurality of signal sources 202, where each signal source is connected to a respective first node $A_i$ of the plurality of elementary filters 311, 312, 313. The first nodes $A_i$ of the plurality of elementary filters 311, 312, 313 may be both an input and an output of the charge sharing band pass filter 303. The input is configured to receive a current signal and the output is configured to provide a voltage signal. The voltage signal may be provided by filtering the current signal 202 based on a filter characteristic of the charge sharing band pass filter 303, e.g. a band pass characteristic as shown in the filter 200 depicted in FIG. 2. The filter characteristic may be a complex-valued band pass filter including an in-phase component and a quadrature component.

The elementary switches $\varphi_i$ of the plurality of elementary filters 311, 312, 313 may be periodically switched. The elementary switches $\varphi_i$ of the plurality of elementary filters 311, 312, 313 may be switched based on a sampling period. A charge accumulated in the rotating capacitor $C_R$ and the history capacitors $C_H$ of the plurality of elementary filters 311, 312, 313 may be based on the sampling period.

The elementary switches $\varphi_i$ of the plurality of elementary filters 311, 312, 313 may be switched based on a multi-phase switching signal, e.g. as depicted in one of the FIGS. 4B, 5B, 6B, 7B, 9B, 10B, 11B, 12B. The multi-phase switching signal may provide a first signal level, e.g. a signal high level or a signal low level, for one elementary switch $\varphi_i$ of the plurality of elementary filters 311, 312, 313 while providing a second signal level, e.g. a corresponding signal low level or a signal high level, for the other elementary switches $\varphi_i$ of the plurality of elementary filters 311, 312, 313.

The rotating capacitor $C_R$, the elementary switches $\varphi_i$ of the plurality of elementary filters 311, 312, 313 and the history capacitors $C_H$ of the plurality of elementary filters may be transistors, for example metal-oxide semiconductor field-effect transistors (MOSFETs) or may comprise metal capacitors for $C_R$ and $C_H$.

FIG. 3D shows a block diagram of a first order charge sharing band pass filter 304 cascaded with first order IIR filter in n/(2n) mode according to an implementation form.

The charge sharing filter 304 includes a rotating capacitor $C_R$; and a plurality of elementary filters 311, 312, 313. Each elementary filter includes an elementary switch $\varphi_i$ (i=1, 3, ..., 2n−1) coupled between a first node $A_i$ (i=1, 2, ..., n) of the respective elementary filter and a second node $B_i$ (i=1, 2, ..., n) of the respective elementary filter; and a history capacitor $C_H$ coupled to the second node $B_i$ of the respective elementary filter. The second nodes $B_i$ of the plurality of elementary filters are interconnected with the rotating capacitor $C_R$ in one interconnecting node B such that charges provided by a plurality of signal sources 202, each signal source connected to a respective first node $A_i$ of the plurality of elementary filters, are shared between the history capacitors $C_H$ of the plurality of elementary filters and the rotating capacitor $C_R$ depending on switching states of the elementary switches $\varphi_i$. The structure and function of the plurality of elementary filters 311, 312, 313 may correspond to the structure and function of the plurality of elementary filters 311, 312, 313 described above with respect to FIG. 3C. Reference is made to FIG. 3C.

The charge sharing filter 304 further includes a plurality of second elementary filters 321, 322, 323. Each second elementary filter 321, 322, 323 includes an elementary switch $\varphi_j$ (j=2, 4, ..., 2n) coupled between the interconnecting node B and a third node $D_i$ (i=1, 2, ..., n) of the respective second elementary filter 321, 322, 323; and a history capacitor $C_H$ coupled to the third node $D_i$ such that charges provided by the plurality of signal sources 202 are shared between the history capacitors $C_H$ of the plurality of elementary filters 311, 312, 313, the history capacitors $C_H$ of the plurality of second elementary filters 321, 322, 323 and the rotating capacitor $C_R$ depending on switching states of the elementary switches $\varphi_i$ of the plurality of elementary filters 311, 312, 313 and the elementary switches $\varphi_j$ of the plurality of second elementary filters 321, 322, 323.

The charge sharing mechanism is described below with respect to FIGS. 4 to 7.

The plurality of second elementary filters 321, 322, 323 may be partitioned in cascades of first order IIR filters 321, 322, 323, such that each second elementary filter 321, 322, 323 forms one first order IIR filter.

The first nodes $A_i$ of the plurality of elementary filters 311, 312, 313 may be an input of the charge sharing band pass filter 304, where the input is configured to receive a current signal. The third nodes $D_i$ of the plurality of second elementary filters 321, 322, 323 may be an output of the charge sharing band pass filter 304, where the output is configured to provide a voltage signal. The voltage signal may be provided by filtering the input signal based on a filter characteristic of the charge sharing filter, e.g. by the band pass filter described above with respect to FIG. 2.

FIG. 3E shows a block diagram of a first order charge sharing band pass filter 305 cascaded with third order IIR filter in n/(4n) mode according to an implementation form. The charge sharing band pass filter 305 includes a rotating capacitor $C_R$; and a plurality of elementary filters 311, 312, 313. Each elementary filter includes an elementary switch $\varphi_i$ (i=1, 5, ..., 4n−3) coupled between a first node $A_i$ (i=1, 2, ..., n) of the respective elementary filter and a second node $B_i$ (i=1, 2, ..., n) of the respective elementary filter; and a history capacitor $C_H$ coupled to the second node $B_i$ of the respective elementary filter. The second nodes $B_i$ of the plurality of elementary filters are interconnected with the rotating capacitor $C_R$ in one interconnecting node B such that charges provided by a plurality of signal sources 202, each signal source connected to a respective first node $A_i$ of the plurality of elementary filters, are shared between the history capacitors $C_H$ of the plurality of elementary filters and the rotating capacitor $C_R$ depending on switching states of the elementary switches $\varphi_i$. The structure and function of the plurality of elementary filters 311, 312, 313 may correspond to the structure and function of the plurality of elementary filters 311, 312, 313 described above with respect to FIGS. 3C and 3D. Reference is made to FIGS. 3C and 3D.

The charge sharing band pass filter 305 further includes a plurality of second elementary filters 321, 322, 323, 324, 325, 326, 327, 328, 329. Each second elementary filter 321, 322, 323, 324, 325, 326, 327, 328, 329 includes an elementary switch $\varphi_j$ (j=1, 2, 3, 4, 6, 7, 8, . . . , 4n-2, 4n-1, 4n) coupled between the interconnecting node B and a third node $D_i$ (i=1, 2, 3, 4, 5, 6, . . . , n-2, n-1, n) of the respective second elementary filter 321, 322, 323, 324, 325, 326, 327, 328, 329; and a history capacitor $C_H$ coupled to the third node $D_i$ such that charges provided by the plurality of signal sources 202 are shared between the history capacitors $C_H$ of the plurality of elementary filters 311, 312, 313, the history capacitors $C_H$ of the plurality of second elementary filters 321, 322, 323, 324, 325, 326, 327, 328, 329 and the rotating capacitor $C_R$ depending on switching states of the elementary switches $\varphi_i$ of the plurality of elementary filters 311, 312, 313 and the elementary switches $\varphi_j$ of the plurality of second elementary filters 321, 322, 323, 324, 325, 326, 327, 328, 329.

The structure and function of the plurality of second elementary filters 321, 322, 323, 324, 325, 326, 327, 328, 329 may correspond to the structure and function of the plurality of second elementary filters 321, 322, 323 described above with respect to FIG. 3D. Reference is made to FIG. 3D.

The charge sharing mechanism is described below with respect to FIGS. 4 to 7.

The plurality of second elementary filters 321, 322, 323, 324, 325, 326, 327, 328, 329 may be partitioned in cascades of third order IIR filters. Each triplet of three second elementary filters, for example a first triplet of second elementary filters 321, 322, 323, a second triplet of second elementary filters 324, 325, 326, a third triplet of second elementary filters 327, 328, 329 and further triplets not depicted in FIG. 3E may form one third order IIR filter.

Figure 4A:
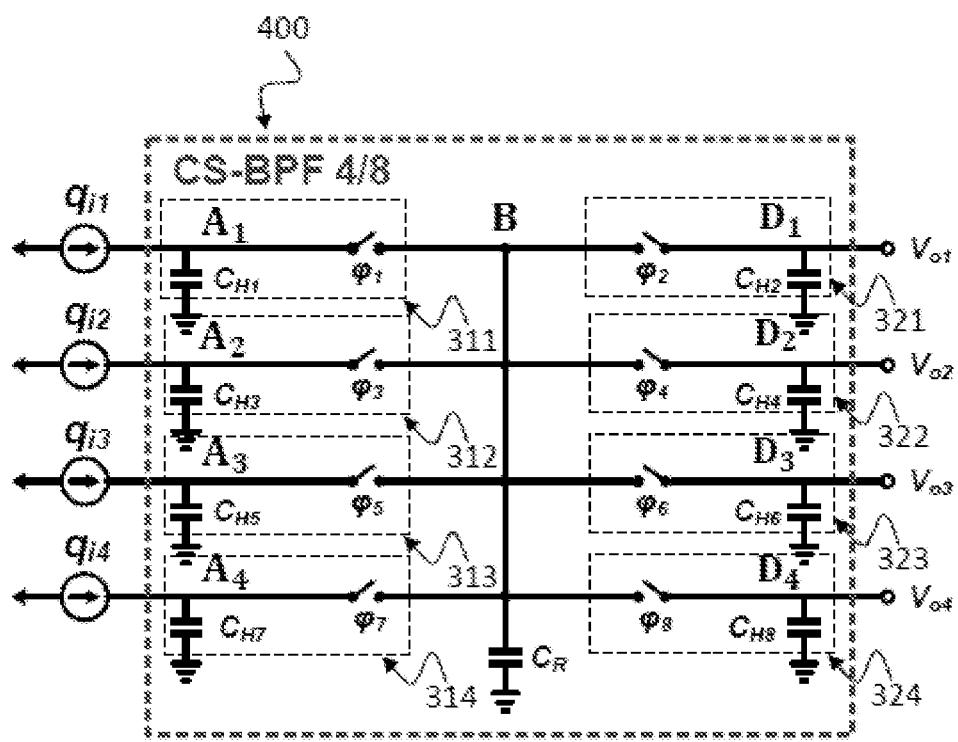
FIG. 4A shows a block diagram of a charge sharing band pass filter 400 in 4/8 mode according to an implementation form.
Figure 4B:
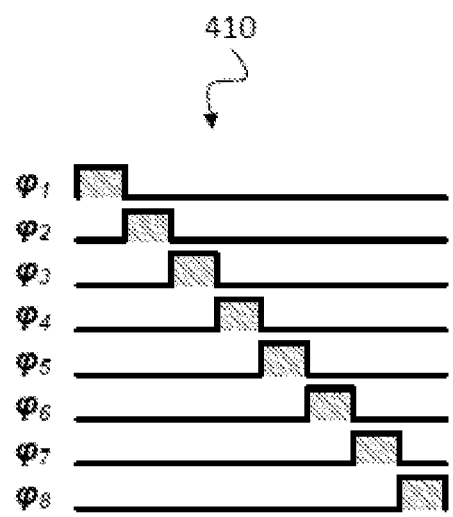

FIG. 4A shows a block diagram of a charge sharing band pass filter 400 in 4/8 mode according to an implementation form. FIG. 4B shows a diagram depicting exemplary switching signals 410 of the charge sharing band pass filter 400 depicted in FIG. 4A.

FIG. 4A shows the basic schematic of the CS-BPF 400 in 4/8 mode. The 4/8 mode means there are four inputs, eight outputs and eight number of phases in the filter. Four input charges, $q_1$, $q_2$, $q_3$, $q_4$ are accumulated in input history capacitors ($C_{H1}$, $C_{H3}$, $C_{H5}$, $C_{H7}$). At the same time, in each phase, rotating capacitor or capacitors, $C_R$, removes a portion of charge proportional to $C_R/(C_H+C_R)$ from each $C_H$ and delivers it to the next $C_H$ in the next input. It should be noted that the CS-BPF can operate with only one $C_R$ sharing charge between the input history capacitors. In that case, the CS-BPF is not full-rate anymore, and its sampling frequency will be equal to $f_{LO}$. By defining the differential output voltages as $V_{d,re}=V_{o1}-V_{o3}$ and $V_{d,im}=V_{o2}-V_{o4}$ the total complex output voltage can be defined as $$V_{oc}=V_{d,re}+j\cdot V_{d,im} \tag{1}$$

The same for input currents, the input complex current can be defined as $$q_{ic}=q_{id,re}+j\cdot q_{id,im} \tag{2}$$

in which $q_{id,re}=q_{i1}-q_{i3}$ and $q_{id,im}=q_{i2}-q_{i4}$. One can derive the simplified z-domain transfer function from input to the output as $$H(z)=\frac{V_{oc}(z)}{q_{ic}(z)}=\frac{1/(C_R+C_H)}{(1-\alpha z^{-1})^2-e^{j\pi/2}((1-\alpha)z^{-1})^2} \tag{3}$$

where $\alpha=C_H/(C_H+C_R)$. The center frequency of the filter is located at $$f_c=\frac{f_s}{2\pi}\arctan\left(\frac{\sin(\frac{\pi}{4})\cdot(1-\alpha)}{\alpha+\cos(\frac{\pi}{4})\cdot(1-\alpha)}\right)\approx\frac{\sin(\frac{\pi}{4})}{2\pi RC_H} \tag{4}$$

and the bandwidth of the filter is equal to $$\omega_{3dB}\approx\frac{4\cdot\sin^2(\frac{\pi}{8})}{RC_H} \tag{5}$$

where, R is the discrete-time equivalent resistance of $C_R$ and is equal to $1/(C_R\cdot f_s)$. Also, according to the definition of the quality factor (Q) which is the center frequency divided to the bandwidth, the quality factor of the filter is equal to Q=0.5·cot g($\pi$/8)≈1.21.

Figure 5A:
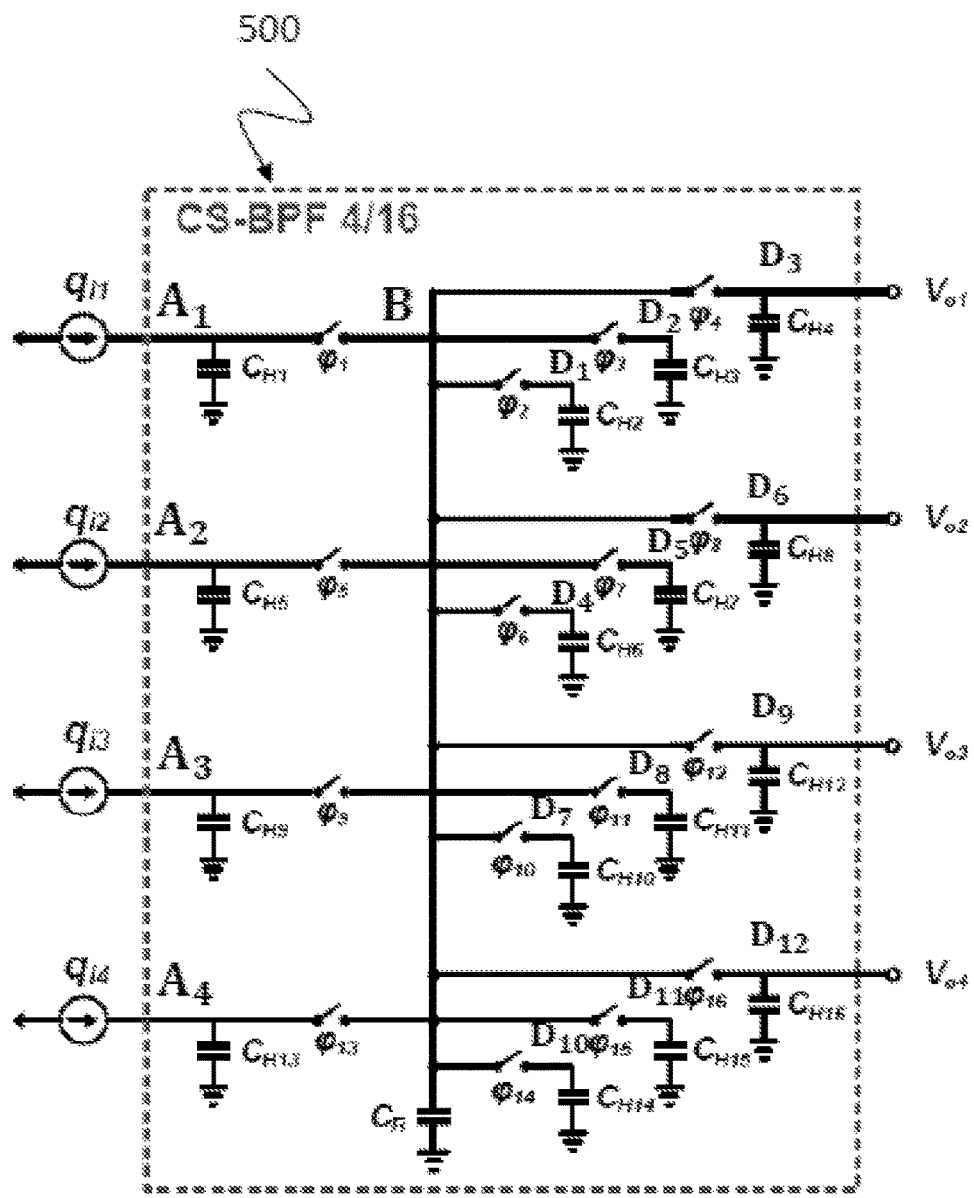
FIG. 5A shows a block diagram of a charge sharing band pass filter 500 in 4/16 mode according to an implementation form.
Figure 5B:
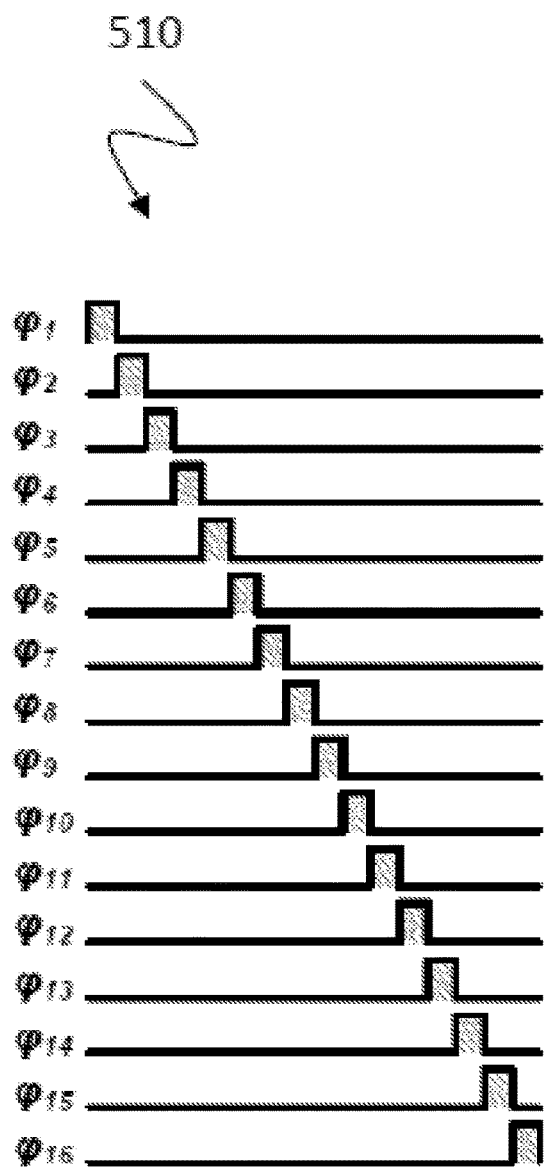

FIG. 5A shows a block diagram of a charge sharing band pass filter 500 in 4/16 mode according to an implementation form. FIG. 5B shows a diagram depicting exemplary switching signals 510 of the charge sharing band pass filter 500 depicted in FIG. 5A.

FIG. 5A shows the basic schematic of the CS-BPF in 4/16 mode. The name 4/16 stands for 4 number of inputs, 4 number of outputs and 16 number of phases. Inputs in this circuit are complex charges ($qi_1$, $qi_2$, $qi_3$, $qi_4$). The same as CS-BPF in 4/8 mode, $C_R$ does a charge-sharing between input $C_H$ capacitors ($C_{H1}$, $C_{H5}$, $C_{H9}$, . . . , $C_{H13}$). In each phase, $C_R$ takes charge from input $C_H$ capacitors ($C_{H1}$, $C_{H5}$, $C_{H9}$, $C_{H13}$). In the next phases, $C_R$ is connected to the intermediary and output $C_H$ capacitors ($C_{H2}$, $C_{H4}$, $C_{H6}$, $C_{H7}$ . . . , $C_{H16}$). This technique will make a BPF due to the charge-sharing between I/Q paths cascaded by the three Low-Pass Filters (LPF) at the intermediary nodes and output node. The step-by step details of how the low-pass IIR filter is being cascaded by CS-BPF for a simple case is depicted in FIG. 3. After $C_R$ connected to the output node, in the next phase the low pass filtered charge in $C_R$ will be delivered to the next $C_H$ in the complex inputs. This mechanism will continue in all 16 phases to complete the circle of 16 clock (CLK) phases. By defining the differential output voltages as $V_{d,re}=V_{o1}-V_{o3}$ and $V_{d,im}=V_{o2}-V_{o4}$, the total complex output voltage can be defined as $$V_{oc}=V_{d,re}+j\cdot V_{d,im}. \tag{6}$$

The same for input currents, the input complex current could be defined as $$q_{ic}=q_{id,re}+j\cdot q_{id,im}. \tag{7}$$

in which $q_{id,re}=q_{i1}-q_{i3}$ and $q_{id,im}=q_{i2}-q_{i4}$. One can derive the simplified z-domain transfer function from input to the output as $$H(z) = \frac{V_{oc}(z)}{q_{ic}(z)} = \frac{1/(C_R + C_H)}{(1 - \alpha z^{-1})^4 - e^{j\pi/2}((1-\alpha)z^{-1})^4} \quad (8)$$

where $\alpha = C_H/(C_H+C_R)$. The center frequency of the filter is located in $$f_c \approx \frac{\sin(\frac{\pi}{8})}{2\pi RC_H} \quad (9)$$

and the bandwidth of the filter is equal to $$\omega_{3dB} = \frac{4 \cdot \sin^2(\frac{\pi}{16})}{RC_H}. \quad (10)$$

Also, according to the definition of the quality factor (Q) which is the center frequency divided to the bandwidth, the quality factor of the filter is equal to $Q=0.5 \cdot \cot g(\pi/16) \approx 2.51$.

Figure 6A:
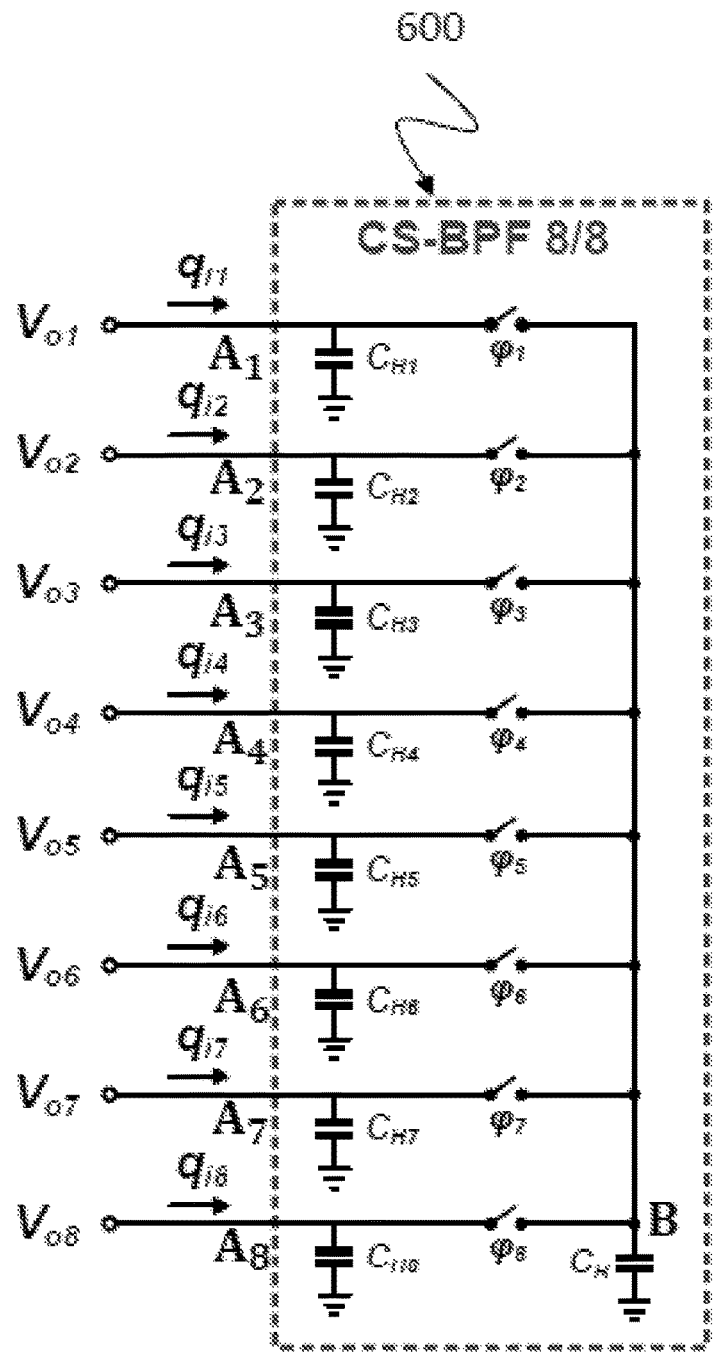
FIG. 6A shows a block diagram of a charge sharing band pass filter 600 in 8/8 mode according to an implementation form.
Figure 6B:
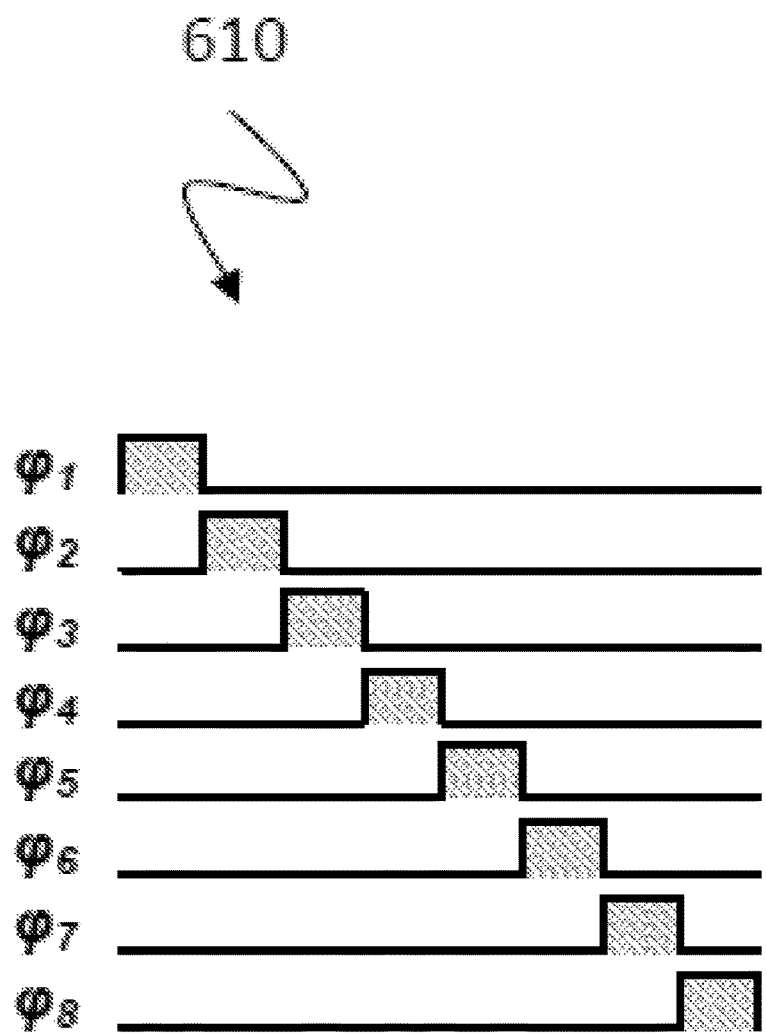

FIG. 6A shows a block diagram of a charge sharing band pass filter 600 in 8/8 mode according to an implementation form. FIG. 6B shows a diagram depicting exemplary switching signals 610 of the charge sharing band pass filter 600 depicted in FIG. 6A.

FIG. 6A shows the basic schematic of the CS-BPF in 8/8 mode. The 8/8 mode means that there are 8 inputs, 8 outputs and 8 CLK phases in the filter. Eight input charges, qi1, qi2, qi3, qi4, . . . , qi8, are accumulated in the input history capacitors ($C_{H1}$, $C_{H3}$, $C_{H5}$, . . . , $C_{H8}$). At the same time, in each phase, rotating capacitors, $C_R$, remove a portion of the charge proportional to $C_R/(C_H+C_R)$ from each $C_H$ and deliver it to the next $C_H$ during the next input. It should be noted that the CS-BPF could operate with only one $C_R$ sharing charge between the input history capacitors. In that case, the CS-BPF is not full-rate, and its sampling frequency is equal to $f_{LO}$. By defining the differential output voltages as $V_{od1}=V_{o1}-V_{o5}$, $V_{od2}=V_{o2}-V_{o6}$, $V_{od3}=V_{o3}-V_{o7}$ and $V_{od4}=V_{o4}-V_{o8}$, the total complex output voltage can be defined as $$V_{oc}=V_{od1} \cdot e^{j\pi 0}+V_{od2} \cdot e^{j\pi/4}+V_{od3} \cdot e^{j\pi/2}+V_{od4} \cdot e^{j3\pi/4}. \quad (11)$$

The same applies for the input currents. The integrated input complex current could be defined as $$q_{ic}=q_{id1} \cdot e^{j\pi 0}+q_{id2} \cdot e^{j\pi/4}+q_{id3} \cdot e^{j\pi/2}+q_{id4} \cdot e^{j3\pi/4} \quad (12)$$

in which $q_{id1}=q_{i1}-q_{i5}$, $q_{id2}=q_{i2}-q_{i6}$, $q_{id3}=q_{i3}-q_{i7}$ and $q_{id4}=q_{i4}-q_{i8}$. One can derive the simplified z-domain transfer function from the complex input to the complex output as $$H(z) = \frac{V_{oc}(z)}{q_{ic}(z)} = \frac{1/(C_R + C_H)}{(1 - \alpha z^{-1})^1 - e^{j\pi/4}((1-\alpha)z^{-1})^1} \quad (13)$$

where $\alpha = C_H/(C_H+C_R)$. The center frequency of the filter is located at $$f_c = \frac{f_s}{2\pi}\arctan\left(\frac{\sin(\frac{\pi}{4}) \cdot (1 - \alpha)}{\alpha + \cos(\frac{\pi}{4}) \cdot (1 - \alpha)}\right) \approx \frac{\sin(\frac{\pi}{4})}{2\pi RC_H} \quad (14)$$

and the bandwidth of the filter is equal to $$\omega_{3db} \approx \frac{4 \cdot \sin^2(\frac{\pi}{8})}{RC_H} \quad (15)$$

where, R is the discrete-time equivalent resistance of $C_R$ and is equal to $1/(C_R \cdot f_S)$. Also, according to the definition of the quality factor (Q), which is the center frequency divided to the bandwidth, the quality factor of the filter is equal to $Q=0.5 \cdot \cot g(\pi/8) \approx 1.21$.

Figure 7A:
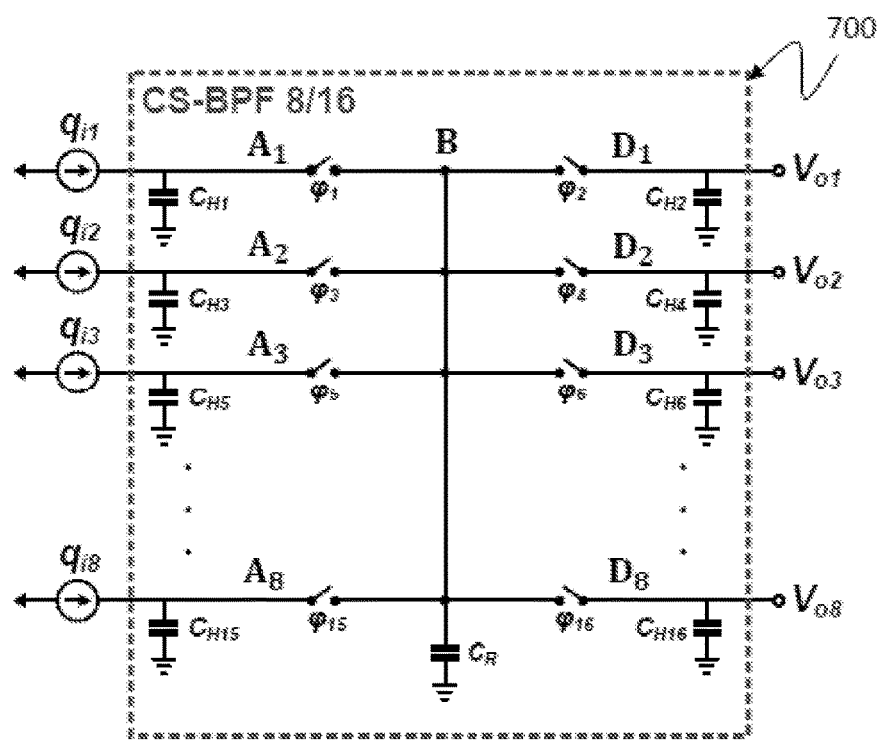
FIG. 7A shows a block diagram of a charge sharing band pass filter 700 in 8/16 mode according to an implementation form.
Figure 7B:
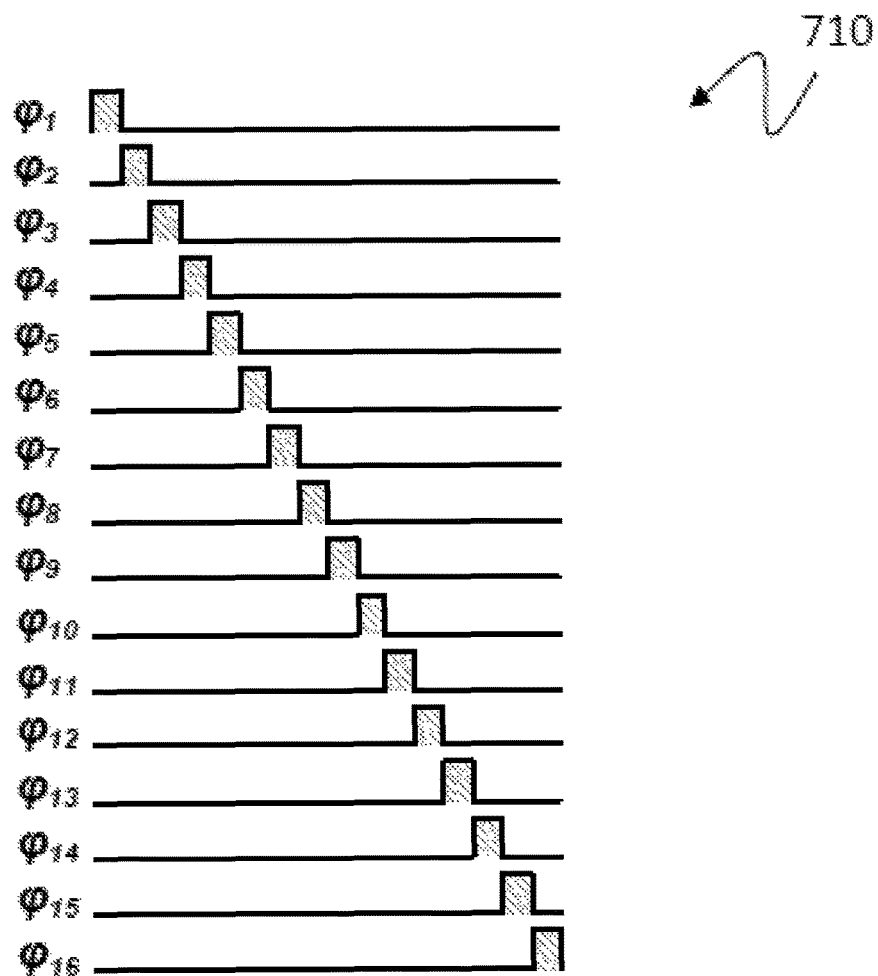

FIG. 7A shows a schematic diagram of a charge sharing band pass filter 700 in 8/16 mode according to an implementation form. FIG. 7B shows a diagram depicting exemplary switching signals 710 of the charge sharing band pass filter 700 depicted in FIG. 7A.

FIG. 7A shows the basic schematic of the proposed CS-BPF in 8/16 mode. The 8/16 mode stands for 8 inputs, 8 outputs and 16 CLK phases. Inputs in this circuit are complex charges ($q_{i1}$, $q_{i2}$, $q_{i3}$, $q_{i4}$, . . . , $q_{i8}$). The same as CS-BPF in 8/8 mode, $C_R$ does a charge-sharing between the input $C_H$ capacitors ($C_{H1}$, $C_{H3}$, $C_{H5}$, . . . , $C_{H15}$). In each phase, $C_R$ takes a charge from the input $C_H$ capacitors. In the following phase, $C_R$ is connected to the output $C_H$ capacitors ($C_{H2}$, $C_{H4}$, $C_{H6}$, . . . , $C_{H16}$). This technique will create a BPF due to the charge-sharing cascaded by the LPF positioned at the output. The step-by step details of how the low-pass IIR filter is cascaded by CS-BPF for a simple case is depicted in FIG. 3. After the LPF charge-sharing, in the next phase, the low pass filtered charge in $C_R$ will be delivered to the next $C_H$ in the complex input. This mechanism will continue in all 16 phases to complete the cycle of 16 CLK phases. By defining the differential output voltages as $V_{od1}=V_{o1}-V_{o5}$, $V_{od2}=V_{o2}-V_{o6}$, $V_{od3}=V_{o3}-V_{o7}$ and $V_{od4}=V_{o4}-V_{o8}$, the total complex output voltage can be defined as $$V_{oc}=V_{od1} \cdot e^{j\pi 0}+V_{od2} \cdot e^{j\pi/4}+V_{od3} \cdot e^{j\pi/2}+V_{od4} \cdot e^{j3\pi/4}. \quad (16)$$

The same as for the integrated input currents, the input complex current could be defined as $$q_{ic}=q_{id1} \cdot e^{j\pi 0}+q_{id2} \cdot e^{j\pi/4}+q_{id3} \cdot e^{j\pi/2}+q_{id4} \cdot e^{j3\pi/4} \quad (17)$$

in which $q_{id1}=q_{i1}-q_{i5}$, $q_{id2}=q_{i2}-q_{i6}$, $q_{id3}=q_{i3}-q_{i7}$ and $q_{id4}=q_{i4}-q_{i8}$. One can derive the simplified z-domain transfer function from the input to the output as $$H(z) = \frac{V_{oc}(z)}{q_{ic}(z)} = \frac{1/(C_R + C_H)}{(1 - \alpha z^{-1})^2 - e^{j\pi/4}((1-\alpha)z^{-1})^2} \quad (18)$$

where $\alpha = C_H/(C_H+C_R)$. The center frequency of the filter is located at $$f_c \approx \frac{\sin(\frac{\pi}{8})}{2\pi RC_H} \quad (19)$$

and the bandwidth of the filter is equal to $$\omega_{3db} \approx \frac{4 \cdot \sin^2\left(\frac{\pi}{16}\right)}{RC_H}. \tag{20}$$

The quality factor of the filter is equal to Q=0.5·cot g(π/16)≈2.51.

Figure 8A:
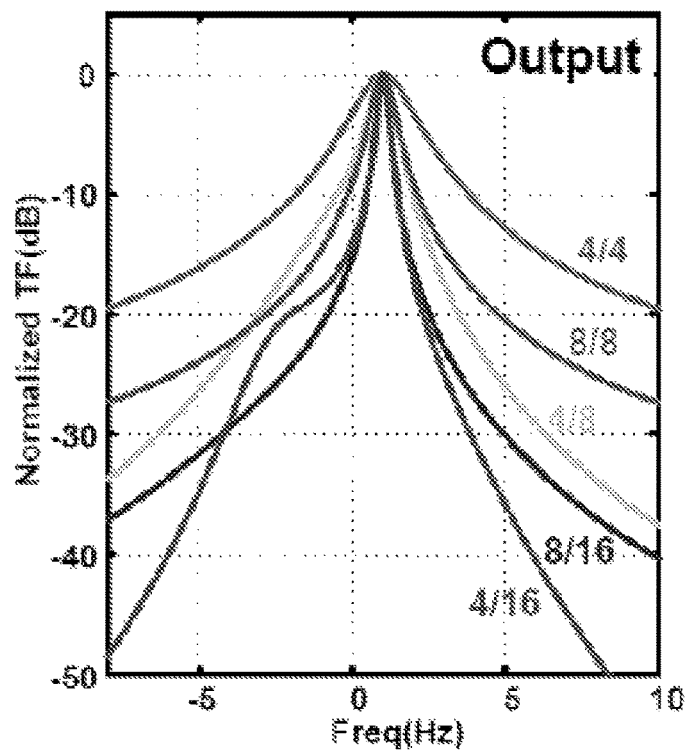
FIGS. 8A-8B shows normalized frequency responses of a charge sharing band pass filter in different modes according to an implementation form.
Figure 8B:
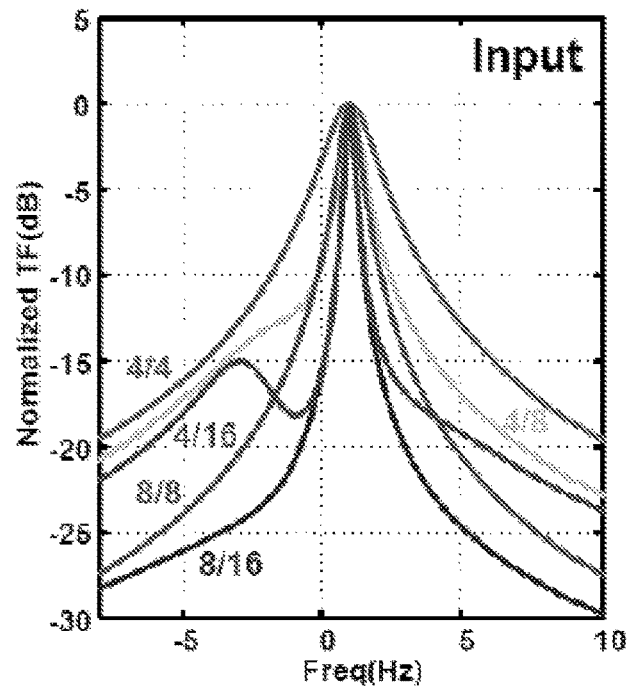

FIGS. 8A and 8B show transfer functions of normalized frequency responses of a charge sharing band pass in different modes according to an implementation form. The normalized frequency responses of the filters described above with respect to FIGS. 4 to 7 using equation (13) and (18) are shown in FIG. 8 for both the input (FIG. 8B) and the output (FIG. 8A) nodes of filters for a same center frequency.

The final schematics of the full-rate CS-BPF in 4/8, 4/16, 8/8 and 8/16 modes are shown in FIGS. 9, 10, 11 and 12, respectively. In conclusion, the filters provide complex band-pass filtering with high selectivity.

Figure 9A:
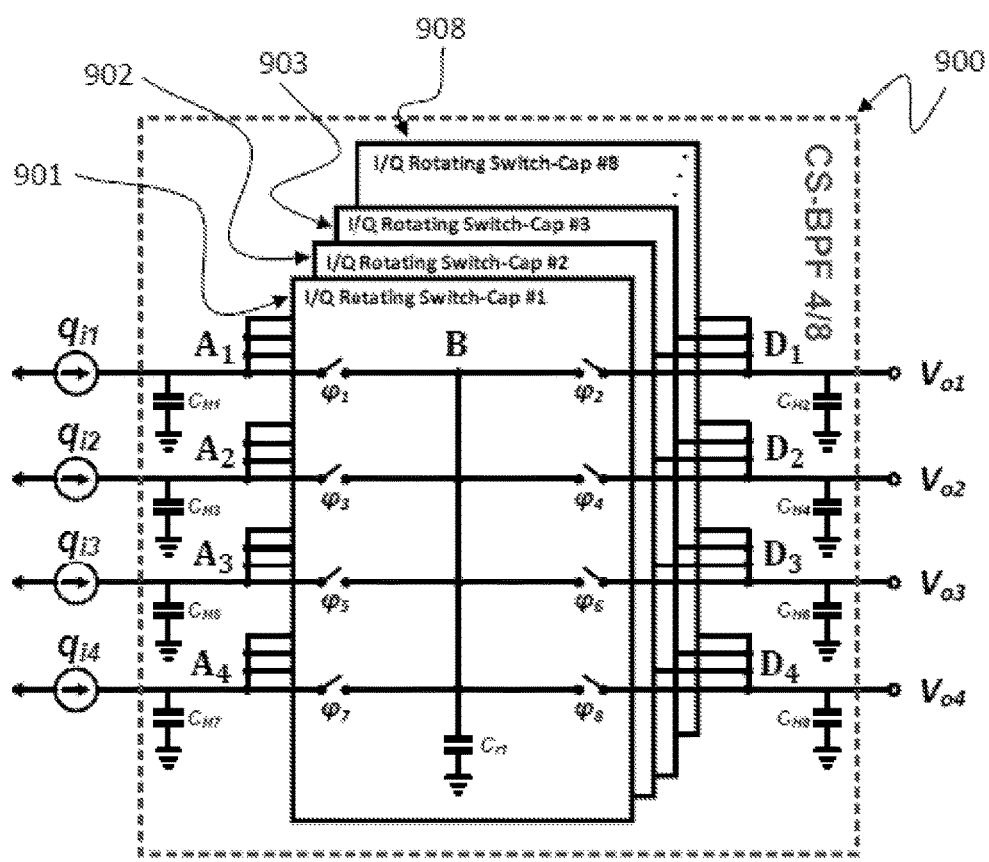
FIG. 9A shows a complete schematic block diagram of a full-rate charge sharing band pass filter 900 in 4/8 mode according to an implementation form.
Figure 9B:
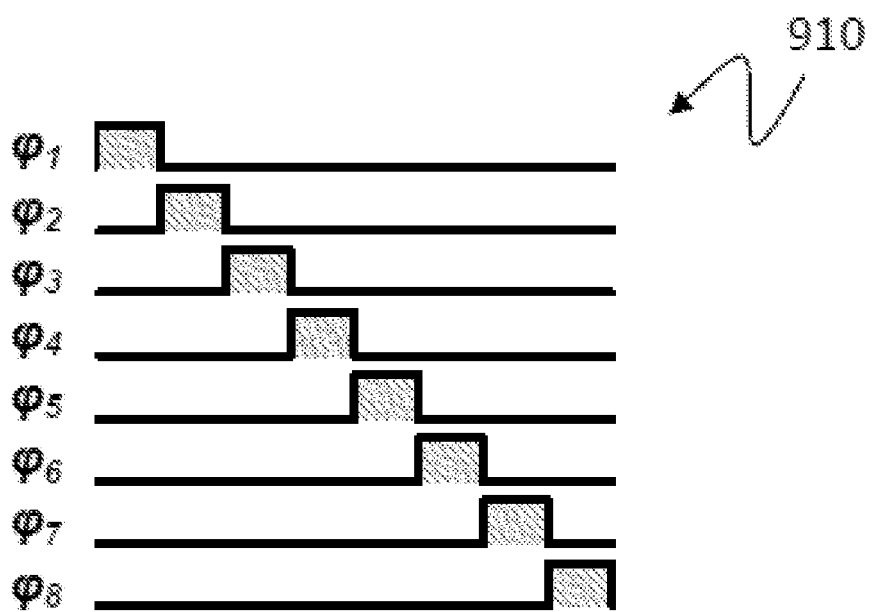
FIG. 9B shows a timing diagram depicting exemplary switching signals 910 of the charge sharing band pass filter 900 depicted in FIG. 9A.

FIG. 9A shows a complete schematic block diagram of a full-rate charge sharing band pass filter 900 comprising I/Q rotating switch capacitors 901, 902, 903 and 908 in 4/8 mode according to an implementation form. FIG. 9B shows a diagram depicting exemplary switching signals 910 of the charge sharing band pass filter 900 depicted in FIG. 9A.

Figure 10A:
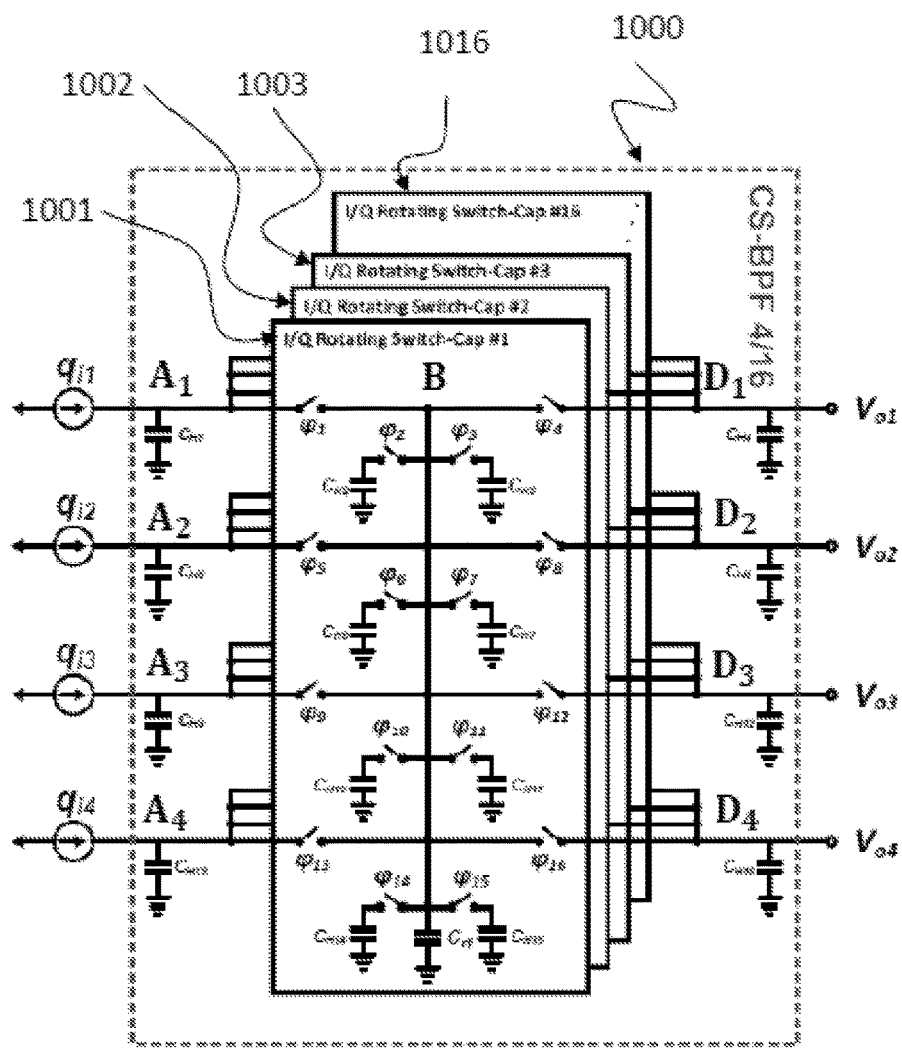
FIG. 10A shows a complete schematic block diagram of a full-rate charge sharing band pass filter 1000 in 4/16 mode according to an implementation form.
Figure 10B:
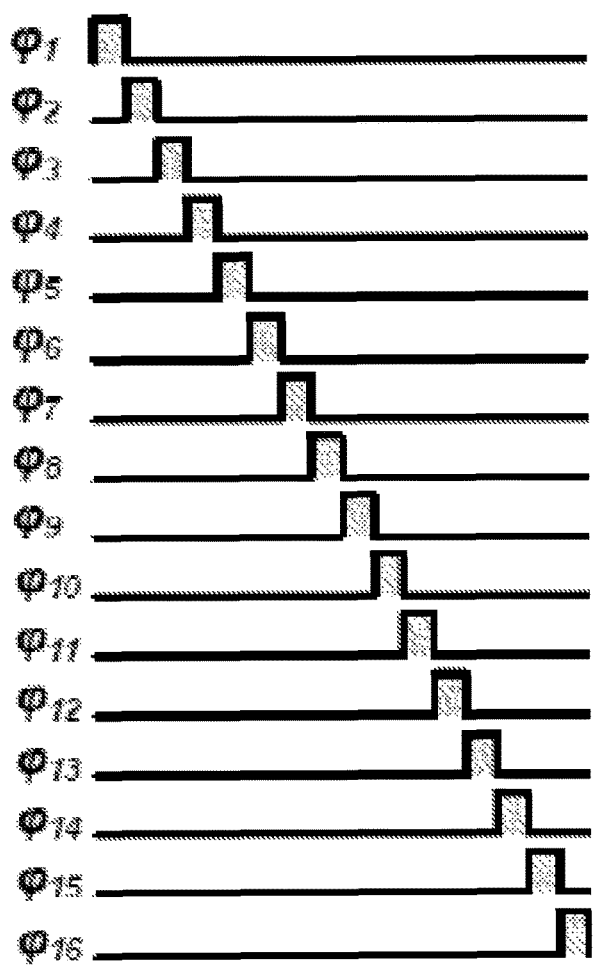
FIG. 10B shows a diagram depicting exemplary switching signals 1010 of the charge sharing band pass filter 1000 depicted in FIG. 10A.

FIG. 10A shows a complete schematic block diagram of a full-rate charge sharing band pass filter 1000 comprising I/Q rotating switch capacitors 1001, 1002, 1003 and 1016 in 4/16 mode according to an implementation form. FIG. 10B shows a diagram depicting exemplary switching signals 1010 of the charge sharing band pass filter 1000 depicted in FIG. 10A.

Figure 11A:
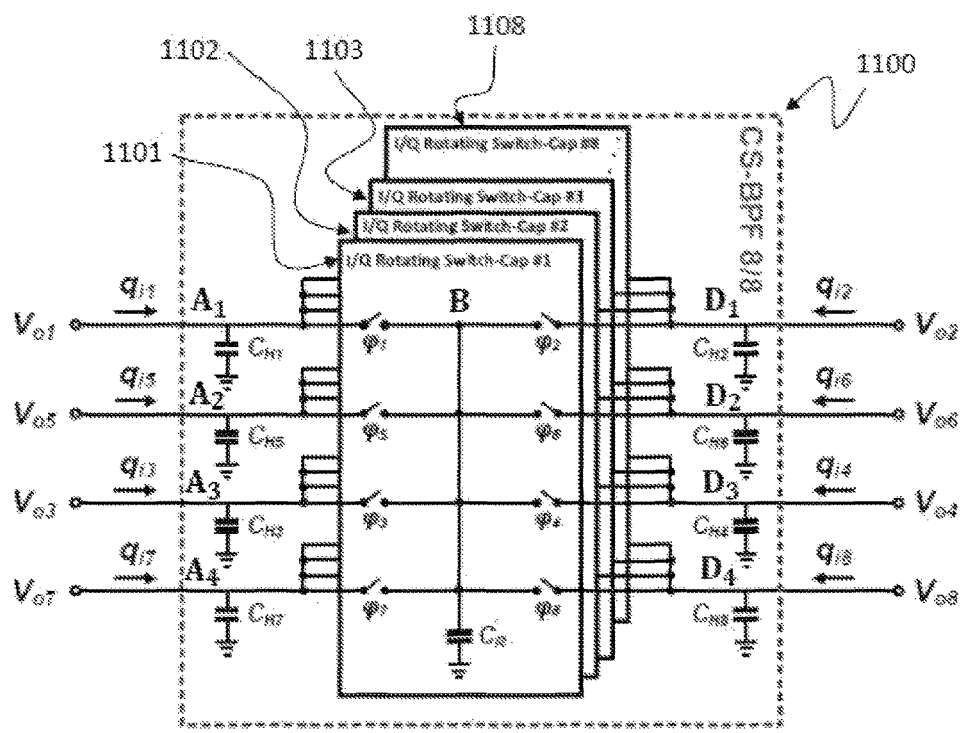
FIG. 11A shows a complete schematic block diagram of a full-rate charge sharing band pass filter 1100 in 8/8 mode according to an implementation form.
Figure 11B:
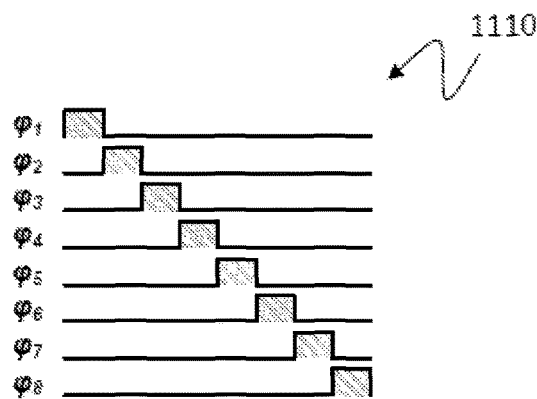
FIG. 11B shows a diagram depicting exemplary switching signals 1110 of the charge sharing band pass filter 1100 depicted in FIG. 11A.

FIG. 11A shows a complete schematic block diagram of a full-rate charge sharing band pass filter 1100 comprising I/Q rotating switch capacitors 1101, 1102, 1103 and 1108 in 8/8 mode according to an implementation form. FIG. 11B shows a diagram depicting exemplary switching signals 1110 of the charge sharing band pass filter 1100 depicted in FIG. 11A.

Figure 12A:
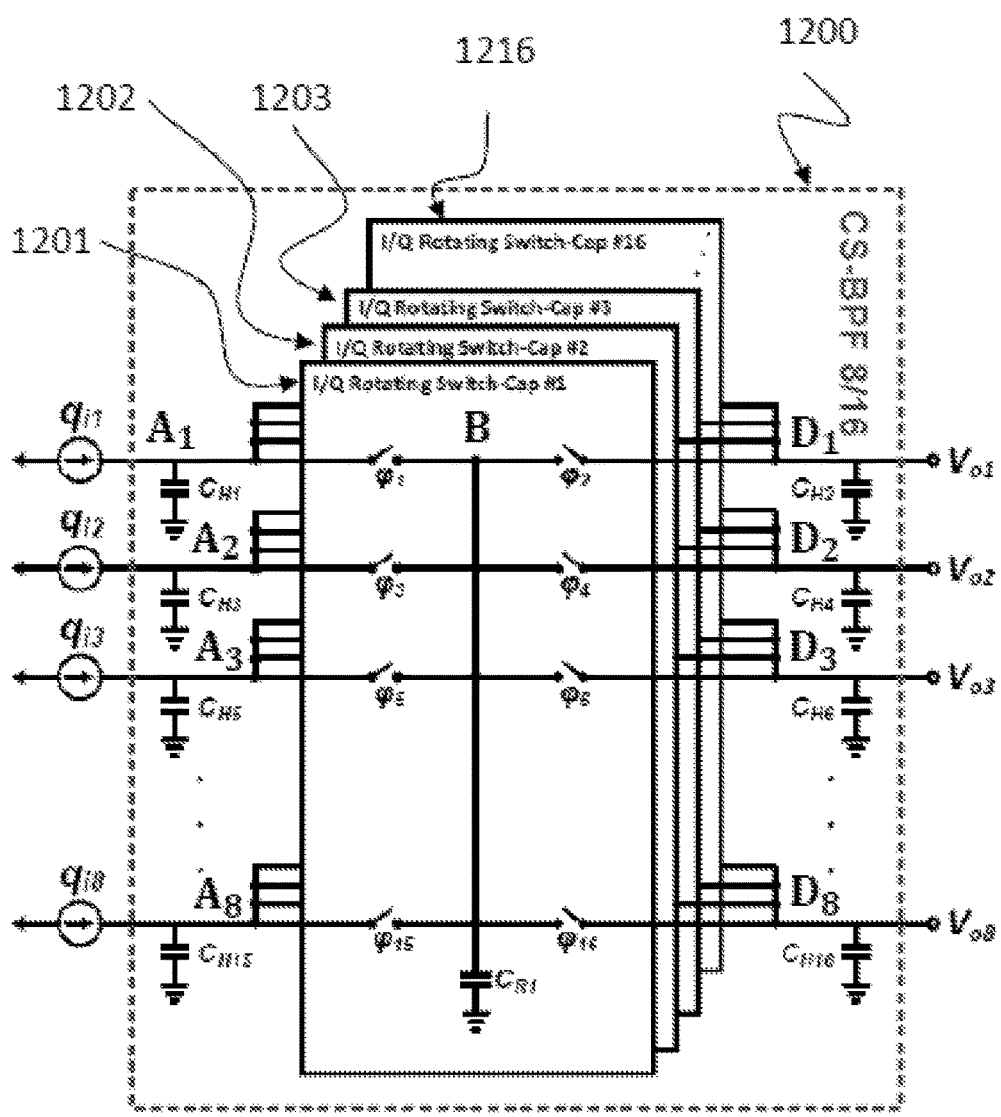
FIG. 12A shows a complete schematic block diagram of a full-rate charge sharing band pass filter 1200 in 8/16 mode according to an implementation form.
Figure 12B:
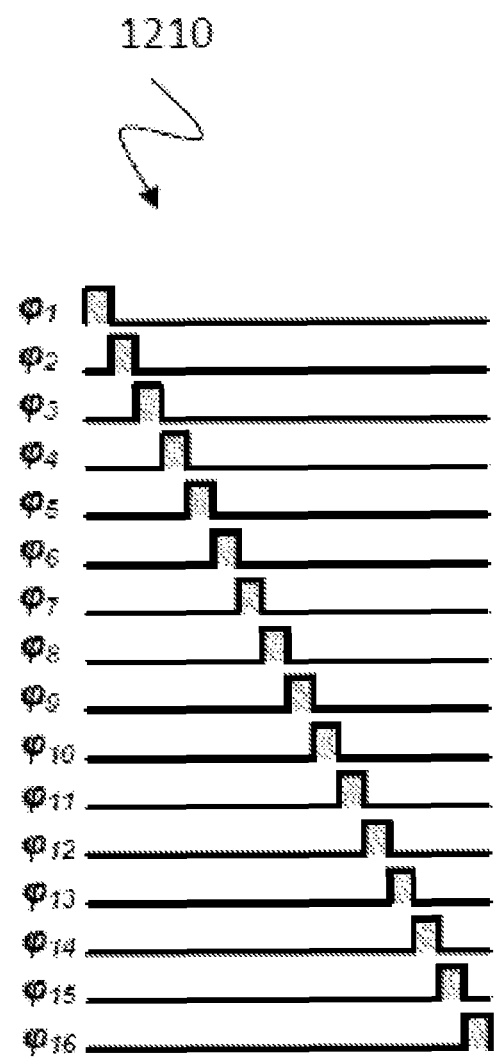
FIG. 12B shows a diagram depicting exemplary switching signals 1210 of the charge sharing band pass filter 1200 depicted in FIG. 12A.

FIG. 12A shows a complete schematic block diagram of a full-rate charge sharing band pass filter 1200 comprising I/Q rotating switch capacitors 1201, 1202, 1203 and 1216 in 8/16 mode according to an implementation form. FIG. 12Bb shows a diagram depicting exemplary switching signals 1210 of the charge sharing band pass filter 1200 depicted in FIG. 12A.

Figure 13:
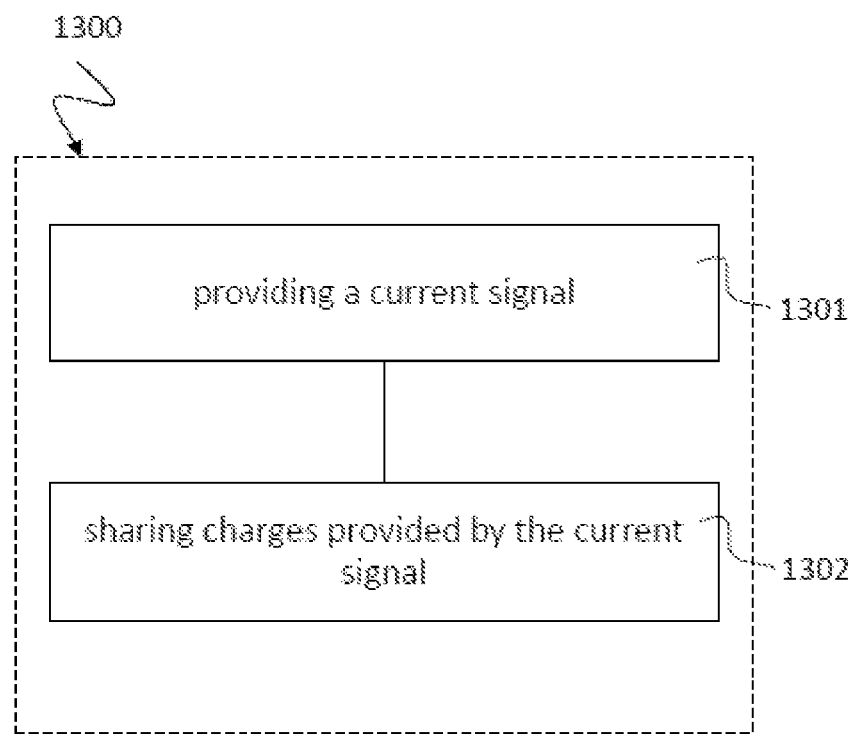
FIG. 13 shows a schematic diagram illustrating a method 1300 for filtering a current signal by a charge sharing filter according to an implementation form.

FIG. 13 shows a flow diagram illustrating a method 1300 for filtering a current signal by a charge sharing filter according to an implementation form. The current signal may be a current signal 202 as described above with respect to FIGS. 2 to 12. The charge sharing filter may be one of the charge sharing filters as described above with respect to FIGS. 2 to 12.

The charge sharing filter includes a rotating capacitor $C_R$; and a plurality of elementary filters, as described above with respect to FIGS. 2 to 12. Each elementary filter includes: an elementary switch $\varphi_i$ coupled between a first node $A_i$ of the respective elementary filter and a second node Bi of the respective elementary filter; and a history capacitor $C_H$ coupled to the second node $B_i$ of the respective elementary filter. The second nodes $B_i$ of the plurality of elementary filters are interconnected with the rotating capacitor $C_R$ in one interconnecting node B. The method 1300 includes providing 1301 a current signal at the first nodes $A_i$ of the plurality of elementary filters. The method 1300 includes sharing 1302 charges provided by the current signal between the history capacitors $C_H$ of the plurality of elementary filters and the rotating capacitor $C_R$ depending on switching states of the elementary switches $\varphi_i$ to provide a voltage signal at the first nodes $A_i$ of the plurality of elementary filters.

The methods, systems and devices described herein may be implemented as software in a Digital Signal Processor (DSP), in a micro-controller or in any other side-processor or as hardware circuit within an application specific integrated circuit (ASIC) of a DSP or on a chip. The invention can be implemented in digital electronic circuitry, or in computer hardware, firmware, software, or in combinations thereof.

The present disclosure also supports a computer program product including computer executable code or computer executable instructions that, when executed, causes at least one computer to execute the performing and computing steps described herein, in particular the method 1300 as described above with respect to FIG. 13. Such a computer program product may include a readable storage medium storing program code thereon for use by a computer, the program code may perform the method 1300 as described above with respect to FIG. 13.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present inventions has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

The invention claimed is:

1. A charge sharing filter, comprising:
   a rotating capacitor; and
   a plurality of elementary filters, each elementary filter comprising:
      an elementary switch coupled between a first node of the respective elementary filter and a second node of the respective elementary filter; and
      a history capacitor coupled to the first node of the respective elementary filter,
   wherein the second nodes of the plurality of elementary filters are interconnected with the rotating capacitor in one interconnecting node such that input signals provided by a plurality of signal sources, each signal source connected to the respective first node of the plurality of elementary filters, are charge-shared.

2. The charge sharing filter of claim 1, wherein the plurality of signal sources are current sources, and wherein each current source is connected to a respective first node of the plurality of elementary filters.

3. The charge sharing filter of claim 1, wherein the first nodes of the plurality of elementary filters are both an input and an output of the charge sharing filter, wherein the input is configured to receive a current signal and the output is configured to provide a voltage signal, and wherein the voltage signal is provided by filtering the current signal based on a filter characteristic of the charge sharing filter.

4. The charge sharing filter of claim 3, wherein the filter characteristic is a complex-valued band pass filter comprising an in-phase component and a quadrature component.

5. The charge sharing filter of claim 1, wherein the elementary switches of the plurality of elementary filters are periodically switched.

6. The charge sharing filter of claim 1, wherein the elementary switches of the plurality of elementary filters are switched based on a sampling period.

7. The charge sharing filter of claim 6, wherein a charge accumulated in the rotating capacitor and the history capacitors of the plurality of elementary filters is based on the sampling period.

8. The charge sharing filter of claim 1, wherein the elementary switches of the plurality of elementary filters are switched based on a multi-phase switching signal.

9. The charge sharing filter of claim 8, wherein the multi-phase switching signal provides a first signal level for one elementary switch of the plurality of elementary filters while providing a second signal level for the other elementary switches of the plurality of elementary filters.

10. The charge sharing filter of claim 1, wherein the rotating capacitor, the elementary switches of the plurality of elementary filters and the history capacitors of the plurality of elementary filters are transistors.

11. The charge sharing filter of claim 1, further comprising:
    a plurality of second elementary filters, each second elementary filter comprising:
       an elementary switch coupled between the interconnecting node and a third node of the respective second elementary filter; and
       a history capacitor coupled to the third node,
    wherein charges provided by the plurality of signal sources are shared between the history capacitors of the plurality of elementary filters, the history capacitors of the plurality of second elementary filters and the rotating capacitor depending on switching states of the elementary switches of the plurality of elementary filters and the elementary switches of the plurality of second elementary filters.

12. The charge sharing filter of claim 11, wherein the plurality of second elementary filters are partitioned in cascades of first order infinite impulse response (IIR) filters, and wherein each second elementary filter forms one first order IIR filter.

13. The charge sharing filter of claim 11, wherein the plurality of second elementary filters are partitioned in cascades of a higher order third order IIR filters, and wherein each triplet of three second elementary filters forms one third order IIR filter.

14. The charge sharing filter of claim 11, wherein the first nodes of the plurality of elementary filters are an input of the charge sharing filter, wherein the input is configured to receive a current signal, wherein the third nodes of the plurality of second elementary filters are an output of the charge sharing filter, wherein the output is configured to provide a voltage signal, and wherein the voltage signal is provided by filtering the input signal based on a filter characteristic of the charge sharing filter.

15. A method for filtering a signal by a charge sharing filter, the charge sharing filter comprising a rotating capacitor; and a plurality of elementary filters, each elementary filter comprising: an elementary switch coupled between a first node of the respective elementary filter and a second node of the respective elementary filter; and a history capacitor coupled to the first node of the respective elementary filter, wherein the second nodes of the plurality of elementary filters are interconnected with the rotating capacitor in one interconnecting node such that input signals provided by a plurality of signal sources, each signal source connected to the respective first node of the plurality of elementary filters, are charge-shared, the method comprising:
    providing a signal at the first nodes of the plurality of elementary filters.

* * * * *

UNITED STATES PATENT AND TRADEMARK OFFICE
CERTIFICATE OF CORRECTION

PATENT NO. : 10,056,881 B2
APPLICATION NO. : 15/443443
DATED : August 21, 2018
INVENTOR(S) : Iman Madadi, Massoud Tohidian and Robert Bogdan Staszewski Page 1 of 1

It is certified that error appears in the above-identified patent and that said Letters Patent is hereby corrected as shown below:

On the Title Page

Page (2), Item (56), OTHER PUBLICATIONS, Line 10: "WLANN" should read "WLAN"

Signed and Sealed this
Second Day of October, 2018

Andrei Iancu
*Director of the United States Patent and Trademark Office*